(12) United States Patent
Natzle et al.

(10) Patent No.: US 6,858,903 B2
(45) Date of Patent: Feb. 22, 2005

(54) MOSFET DEVICE WITH IN-SITU DOPED, RAISED SOURCE AND DRAIN STRUCTURES

(75) Inventors: Wesley C. Natzle, New Paltz, NY (US); Marc W. Cantell, Sheldon, VT (US); Louis D. Lanzerotti, Charlotte, VT (US); Effendi Leobandung, Wappingers Falls, NY (US); Brian L. Tessier, Poughkeepsie, NY (US); Ryan W. Wuthrich, Burlington, VT (US)

(73) Assignee: International Business Machines Corporation, Armonk, NY (US)

(*) Notice: Subject to any disclaimer, the term of this patent is extended or adjusted under 35 U.S.C. 154(b) by 0 days.

(21) Appl. No.: 10/881,449

(22) Filed: Jun. 30, 2004

(65) Prior Publication Data
US 2004/0248368 A1 Dec. 9, 2004

Related U.S. Application Data

(62) Division of application No. 10/300,239, filed on Nov. 20, 2002, now Pat. No. 6,774,000.

(51) Int. Cl.[7] .............................................. H01L 27/76
(52) U.S. Cl. ........................... 257/368; 257/24; 257/57
(58) Field of Search .......................... 257/24, 57, 368; 438/300

(56) References Cited

U.S. PATENT DOCUMENTS

| | | | |
|---|---|---|---|
| 5,227,330 A | 7/1993 | Agnello et al. | 437/108 |
| 5,241,193 A * | 8/1993 | Pfiester et al. | 257/67 |
| 5,282,925 A | 2/1994 | Jeng et al. | 156/646 |
| 5,378,651 A | 1/1995 | Agnello et al. | 437/106 |
| 5,937,301 A | 8/1999 | Gardner et al. | 438/303 |
| 6,110,787 A | 8/2000 | Chan et al. | 438/300 |
| 6,137,149 A | 10/2000 | Kodama | 257/408 |
| 6,200,867 B1 | 3/2001 | Chen | 438/300 |
| 6,248,637 B1 | 6/2001 | Yu | 438/300 |
| 6,429,084 B1 | 8/2002 | Park et al. | 438/305 |
| 6,440,807 B1 * | 8/2002 | Ajmera et al. | 438/300 |

* cited by examiner

Primary Examiner—David Nelms
Assistant Examiner—Quoc Hoang
(74) Attorney, Agent, or Firm—Graham S. Jones, II; Jay H. Anderson

(57) ABSTRACT

A process for manufacturing an FET device. A semiconductor substrate is covered with a gate dielectric layer and with a conductive gate electrode formed over the gate dielectric. Blanket layers of silicon oxide may be added. An optional collar of silicon nitride may be formed over the silicon oxide layer around the gate electrode. Two precleaning steps are performed. Chemical oxide removal gases are then deposited, covering the device with an adsorbed reactant film. The gate dielectric (aside from the gate electrode) is removed, as the adsorbed reactant film reacts with the gate dielectric layer to form a rounded corner of silicon oxide at the base of the gate electrode. One or two in-situ doped silicon layers are deposited over the source/drain regions to form single or laminated epitaxial raised source/drain regions over the substrate protruding beyond the surface of the gate dielectric.

21 Claims, 12 Drawing Sheets

MOSFET DEVICE WITH IN-SITU DOPED, RAISED SOURCE AND DRAIN STRUCTURES

This is a division of U.S. application Ser. No. 10/300,239 filed Nov. 20, 2002, now U.S. Pat. No. 6,774,000.

BACKGROUND OF THE INVENTION

1. Field of the Invention

This invention relates to a method of manufacture of Metal Oxide Semiconductor (MOS) Field Effect Transistor (FET) devices and more particularly to raised source/drain MOSFET devices.

2. Description of Related Art

In the past, CMOS devices have been constructed by using a combination of photoresist masks and gate polysilicon to mask implanted shallow extensions of the source/drain regions. Implantation follows formation of a gate dielectric and the polysilicon gate. After implantation the substrate is annealed to activate the implanted dopant.

As devices become smaller and more advanced, several problems arise related to this process sequence. There is a tradeoff between the resistance of the extension and problems stemming from the short channel effect. If the extension is heavily implanted, then it has low resistance, but it is impossible to avoid a relatively deep junction and the associated short channel effect from implanted dopant that scatters laterally. Furthermore, multiple high temperature annealing steps are required for activation during construction of CMOS devices. These high temperature annealing steps, in combination with transient enhanced diffusion stemming from implant damage, further contribute to unwanted spreading of dopant into regions where its presence is destructive. Raised source/drain processes avoid some of the problems mentioned. In particular, a set of thicker low resistance source and drain regions are obtained. Since the implanted raised source/drain regions lie above the channel, a portion of the scattering from implanted ions takes place above the channel region. However, some scattering occurs and activation annealing steps and transient enhanced diffusion can contribute to the spreading of dopant. Conventional selective epitaxy, which uses a relatively high deposition temperature and which is usually considered for raised source/drain (S/D) regions, is a higher temperature process that contributes to dopant diffusion and limits gate and dielectric choices for advanced devices and does not enable in-situ doping.

It is also difficult to provide a process sequence and low temperature epitaxial precleaning which does not contribute to low temperature dopant spread.

U.S. Pat. No. 6,235,645 of Habuka et al. for "Process for Cleaning for Silicon Semiconductor Substrates" describes removing organic materials and metal impurities on the surface of the substrate: The process prevents regrowth of a natural oxide film by employing highly reductive atmospheres with a trace of water inherently included in the film as a reaction initiating catalyst. An organic material is decomposed in a $HF/H_2$ mixed gas atmosphere which is preferably set in the range of from 0° C. to 600° C. Cleaning for epitaxial growth is described and cleaning temperatures involving temperatures as high as 1000° C. or more are indicated.

U.S. Pat. No. 5,227,330 of Agnello et al. for "Comprehensive Process for Low Temperature Si Epitaxial Growth" and U.S. Pat. No. 5,378,651 of Agnello et al. for "Comprehensive Process for Low Temperature Epitaxial Growth" describe methods of fabrication of silicon devices and, more particularly, methods of growing of epitaxial layers of silicon by deposition at low temperatures. The Agnello et al. patents describe precleaning when producing low temperature epitaxy (LTE) at atmospheric pressure, and methods for controlling the relative amount of silicon growth on silicon dioxide vs. single crystal. Those patents are directed to producing greater growth on silicon oxide than on single crystal silicon, so that a thicker (and therefore more conductive) extrinsic base can be grown for bipolar transistors instead of CMOS. While precleaning for LTE at low pressure is described, at atmospheric pressure is described, the precleaning step does not produce specialized shapes.

U.S. Pat. No. 6,110,787 of Chen et al. for "Method of Fabricating a MOS Device" describes forming a raised source/drain device with raised STI raised or isolation regions with isolation spacers on the sidewalls, and a gate conductor having gate spacers. Any oxide or contamination on the substrate is removed by using a wet etch of dilute HF. An intrinsic epitaxial silicon, amorphous silicon, or polysilicon layer is selectively deposited, preferably by Selective Epitaxial Growth (SEG). While Chen et al. uses selective epitaxy, it does not suggest use of LTE. Moreover, Chen et al. does not describe an embodiment which is doped in situ instead of being ion implanted.

U.S. Pat. No. 6,248,637 of Yu for "Process for Manufacturing MOS Transistors Having Elevated Source and Drain Regions" describes disposable spacers formed by oxidizing a polysilicon gate electrode over a silicon nitride gate dielectric. Sidewalls of the gate electrode are oxidized selectively providing a semi-conductor and silicide material above the source/drain locations, doping the source location and the drain location to form elevated source and drain regions, driving in the dopant with a high temperature Rapid Thermal Anneal (RTA) followed by a removing the oxide structure to create an opening to use for a halo or pocket ion implant plus forming source/drain extensions through the openings which are self-aligned with the gate electrode stack, followed by a low temperature RTA.

U.S. Pat. No. 6,137,149 of Kodama for "Semiconductor Device Having Raised Source-Drains and Method of Fabricating the Same" describes a method of forming an FET including raised source and drain layers and a particular shaped insulating film formed on a sidewall of a gate electrode. HF is used to remove natural oxide films formed on regions of silicon substrate where source and drain regions to be formed later. The raised source/drain layers are formed by selective epitaxial growth. The second embodiment relies on a chemical difference (using HF, sulfuric and acetic acid etchant) between an amorphous silicon film over silicon oxide and single crystal silicon to remove the silicon only from the silicon oxide surface.

SUMMARY OF THE INVENTION

In accordance with this invention, raised source and drain regions for a CMOS structure are formed by selective or non-selective low temperature epitaxy. In some embodiments of the present invention, the use of fully selective epitaxy is not essential and epitaxial growth with differential selectivity between single crystal surfaces and silicon oxide surfaces is sufficient to produce a device with a gate dielectric layer and a set of epitaxial raised source/drain regions protruding beyond the exterior surface of the gate dielectric. Thus, as an alternative to a fully selective epitaxial process, epitaxial growth with differential selectivity between single crystal and silicon dioxide is sufficient for an epitaxial raised source/drain.

Furthermore, it is advantageous to have a precleaning step which can support both epitaxial growth and selective epitaxial growth of silicon only on exposed areas of silicon without growth thereof over dielectric layers.

The invention uses a process sequence and a combination of processing steps which combines a Chemical Oxide Removal (COR) precleaning step, preferably employing the vapors of HF and ammonia to strip silicon oxide prior to the step of fully selective epitaxial growth of raised source/drain doped silicon regions.

By employing in situ doped source/drains in a process/integration sequence with a COR precleaning step, disadvantages associated with implanted source/drain regions and the high activation temperatures are avoided. For example, as the thickness of gate dielectrics declines, high temperature processing can contribute to the problem of boron penetration of thin gate oxides. Moreover, certain metals, alone or in combination with gate dielectrics (e.g. high dielectric constant (high K) gate dielectrics) can be incompatible with the high temperature processing required for dopant activation. With the present invention, these problems can be effectively addressed, since heat treatment required for driving in dopant following deposition of a doped silicon epitaxial layer is reduced or eliminated relative to that required for activation of dopant/recrystallization of silicon following an implant.

We have found that differential selectivity can be combined with a silicon consumption step such as oxidation to produce a structure similar to that obtained by fully selective epitaxy.

The approach of the invention is to raise the extensions as well as the S/D by using the LTE process. In a preferred embodiment, with in-situ doped LTE, both implantation and high temperature processing are avoided entirely. Any problems caused by lack of selectivity are avoided by the reduced deposition on silicon oxide of LTE silicon followed by oxidation. In the preferred embodiment the LTE silicon is doped in-situ.

The invention uses the natural amount of differential growth on single crystal vs. silicon oxide. What was a disadvantage for the bipolar transistors of Agnello et al U.S. Pat. Nos. 5,227,330 and 5,378,651, supra, (i.e. a reduced deposition rate on silicon oxide compared to the rate on single crystal silicon) is an advantage for CMOS devices when employing the process of this invention. Moreover, the precleaning step that is used (e.g. the COR process) shapes an insulating oxide at the periphery of the gate oxide into a configuration that enables deposition of raised source/drain regions with the natural amount of differential growth. Under some conditions selective growth produces an insulating silicon oxide structure that helps to prevent shorts. Under other conditions deposition occurs on the insulating oxide structure. However, since the deposition amount is reduced on the silicon oxide relative to the single crystal substrate, it is possible to follow deposition with an oxidation step or another step that consumes silicon on the insulating oxide structure while leaving some raised silicon on the source and drain areas.

In accordance with another aspect of this invention, double laminated raised source/drain regions are formed with a set of upper raised source and drain regions formed over the raised source and drain regions.

In accordance with this invention, differential selectivity can be combined with a silicon consumption step, such as oxidation, to produce structures similar to that obtained by fully selective epitaxy.

BRIEF DESCRIPTION OF THE DRAWINGS

The foregoing and other aspects and advantages of this invention are explained and described below with reference to the accompanying drawings, wherein.

DETAILED DESCRIPTION OF PREFERRED EMBODIMENTS

Formation of an FET structure in accordance with this invention involves a pre-cleaning step for shaping dielectric layer configurations followed by an LTE (Low Temperature Epitaxial) silicon deposition step which provides different thicknesses of the deposited silicon layer as a function of differential selectivity between a dielectric such as a silicon oxide layer and the single crystal silicon substrate. The thickness of silicon deposited on a dielectric layer is much less than the thickness of the epitaxial silicon layer deposited upon silicon or polysilicon. The deposited silicon layer may remain amorphous or partially amorphous on the oxide dielectric through some combination of lack of nucleation on the surface prepared by the precleaning step and of the low deposition temperature of the LTE (Low Temperature Epitaxy). We have found that deposition on the amorphous layer is slower than deposition on the (100) crystal face.

First Embodiment: Formation of Selective Blanket, Epitaxial Layer

FIGS. 1A–1F show how an in situ doped, selective epitaxial process can be combined with other processes to form a CMOS device 10 with a set of in situ doped raised source/drain regions 22S/22D above a set of source/drain regions 12S/12D formed in the substrate 12.

Figure 1A:
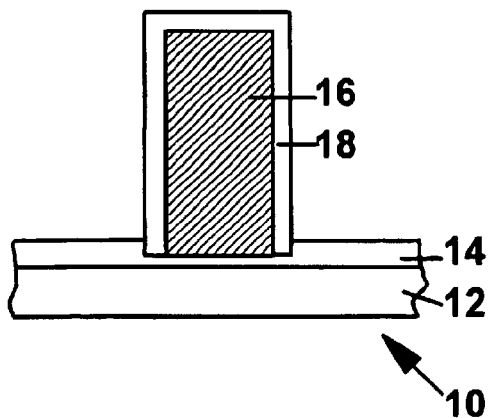
FIGS. 1A–1F show how an in situ doped selective epitaxial process can be combined with other processes to form a CMOS device with a set of in situ doped raised source/drain regions.
Figure 1B:
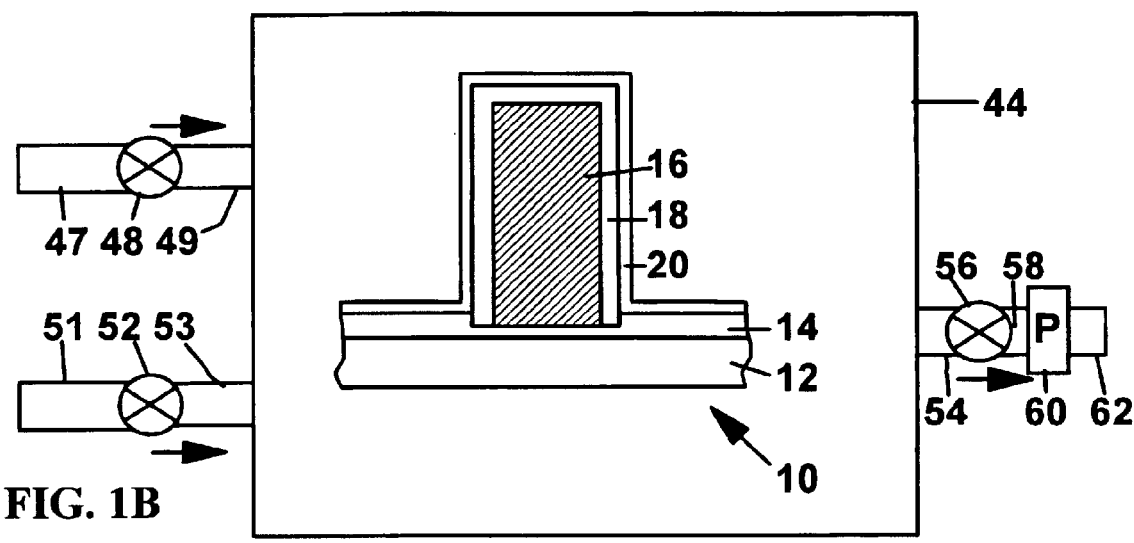

FIG. 1A shows the CMOS device 10 in an intermediate stage of processing. The device 10 includes a gate conductor comprising a conventionally doped polysilicon gate electrode 16 formed on a thin film, gate dielectric 14 (e.g. a gate silicon oxide) which is deposited upon the substrate 12, which comprises a single crystal semiconductor in the form of either a bulk layer or a thin film layer of a semiconductor, such as doped silicon. The gate electrode 16 has been patterned by a conventional process such as a polysilicon RIE (Reactive Ion Etching) process employing photolithography as will be well understood by those skilled in the art of MOSFET fabrication processes. In addition, a reoxidation process has been performed to create a conformal, silicon oxide sidewall layer 18 covering the external surfaces of the polysilicon gate electrode 16. The reoxidation process also will thicken the gate dielectric 14, which in the case illustrated by FIGS 1A and 1B is assumed to be silicon oxide. In that case, there is greater growth of the silicon oxide sidewall layer 18 from about 30 Å to about 75 Å on the sidewalls of the polysilicon gate electrode 16 than the thickness of the gate silicon oxide dielectric 14 from about 20 Å to about 50 Å aside from the gate electrode 16. If the gate dielectric 14 is composed of a material other than silicon oxide, then a different configuration of the layer 14 with a different thickness is obtained, as will be well understood by those skilled in the art.

If the gate electrode 16 is composed of metal, the reoxidized silicon can be replaced with a silicon oxide layer 18 deposited by a process such as CVD TEOS.

FIG. 1B illustrates the result after commencing a step of precleaning of device 10 of FIG. 1A. The precleaning starts with introduction thereof into a COR chamber 44 in which a Chemical Oxide Removal (COR) process uses gas phase reactants to perform a self-limiting etch that is adjustable by controlling the parameters in the COR chamber 44. The COR etching process employed in the present invention comprises a vapor phase chemical oxide removal process in which a combination of the vapors of HF and $NH_3$ are employed as the etchant and carried out under low pressures (10 millitorr or below).

A first reservoir (not shown for convenience of illustration) which is connected to line 47 is filled with a first reactant comprising HF vapor and a second reservoir (not shown for convenience of illustration) which is connected to line 51 is filled with a second reactant comprising $NH_3$ vapor. Valve 48 connects from line 47 through line 49 to an open inlet to the COR chamber 44 for admission of HF vapor into chamber 44. Similarly, the valve 52 connects from line 51 through line 53 to an open inlet to the COR chamber 44 for admission of $NH_3$ vapor into COR chamber 44. Exhaust line 54 connects through exhaust valve 56 to line 58 to the exhaust pump 60 which pumps exhaust gases to outlet line 62 for removal of gases from the COR chamber 44. As shown in commonly assigned U.S. Pat. No. 5,282,925 for "Device and Method for Accurate Etching and Removal of Thin Film" of Jeng, Natzle and Yu a microbalance and a mount may be employed in the process, and the description thereof is incorporated herein by reference since those elements are not shown for convenience of illustration.

In the preferred mode of operation, the exhaust valve 56 to the vacuum pump 60 is open during admission of the first and second reactant gases into the COR chamber 44 after opening of valves 48 and 52. In operation, a COR adsorbed reactant film 20 is caused to be deposited upon the surface of the device 10 when the valves 48 and 52 are opened. Preferably valves 48 and 52 are opened rapidly and simultaneously. The first and second reactants then fill the COR chamber 44 rapidly; the two reactants rapidly form the COR adsorbed reactant film 20, which remains on the exposed surface of the device 10 for a short period of time when the pressure of $NH_3$ and HF is near the vapor pressure at the temperature of the device 10, so that the COR adsorbed reactant film 20 is formed and reactions with the respective surfaces of the reoxidized silicon oxide layer 18 and gate dielectric layer 14 to be etched are initiated.

In FIG. 1B, for purposes of illustration, the adsorbed reactant film 20 is shown, with considerable thickness. However, in fact, an amount of a few monolayers to less than a full monolayer is preferred. FIG. 1B shows the device 10 at the initiation of the reaction.

Figure 1C:
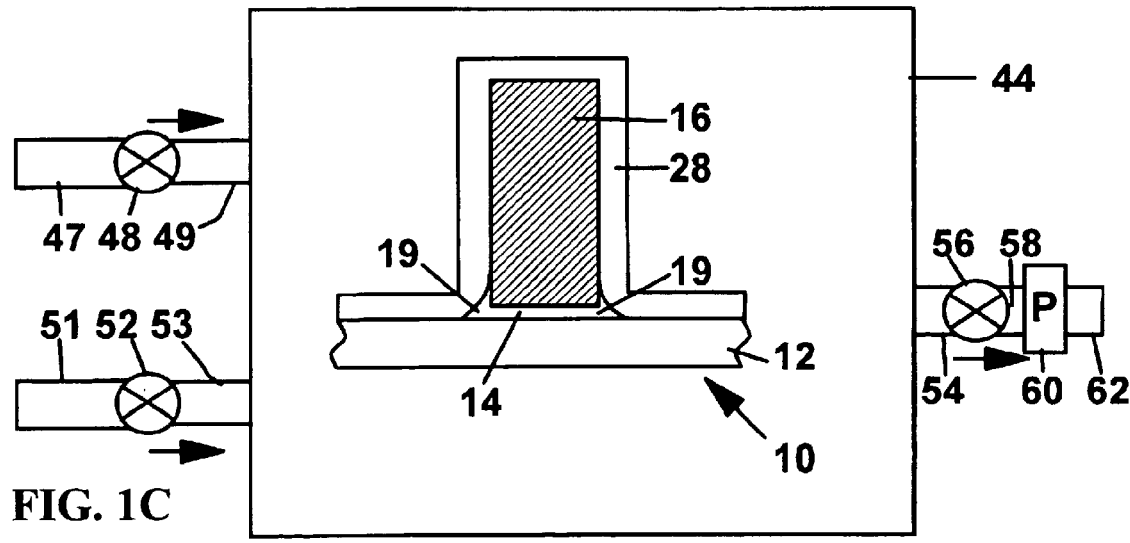

FIG. 1C shows the device of FIG. 1B after a reaction product 28 comprising ammonium hexafluorosilicate has formed beneath the adsorbed reactant film 20 and eventually replaced the adsorbed reactant film 20 and the oxide layers 18 and 14 therebelow. At the completion of the reaction, reactant inlet valves 48 and 52 are closed, eliminating the supply of reactant gases from inlet lines 49 and 53.

Since the exhaust valve 56 remains open, the adsorbed reactant film 20 eventually disappears as HF and $NH_3$ vapors are pumped out of COR chamber 20. Completion of the reaction and the amount of the gate dielectric layer 14 and the reoxidized silicon oxide layer 18 which are removed is a function of the substrate temperature, composition and residence time of the adsorbed reactant film 20. Factors influencing the amount removed per unit time include the vapor pressure of the reactant at the temperature of the substrate 12; the amount of reactant or the rate of reactant admitted to the COR chamber 44; the pumping speed of pump 60; and the reaction rate between the adsorbed reactant film 20 and the reoxidized silicon oxide layer 18 to be etched, all of which can be regulated by a controller as indicated in the Jeng et al. '925 patent.

The HF and $NH_3$ reaction with silicon dioxide is a multiple step process.

First, as illustrated in FIG. 1C, the adsorbed reactant film 20 from the HF and $NH_3$ gases has reacted with reoxidized layer silicon dioxide layer 18 and the portions of the surface of the gate oxide layer 14 in contact therewith to form a condensed, solid COR reaction product 28 thereon beneath the adsorbed reactant film 20 from the reaction between the HF and $NH_3$ gases and the reoxidized layer silicon dioxide layer 18 and the portions of the surface of the gate oxide layer 14 in contact therewith as long as a sufficient vapor pressure of the reactant gases (HF and $NH_3$) remains in the chamber 44. The film 20 continues to reform on the surface of the COR reaction product 28 until the source of gases is depleted at which point the adsorbed reactant film 20 disappears as shown in FIG. 1.

The result is that the reoxidation layer 18 has been removed from the top and the sidewalls of the gate electrode 16 and the gate oxide layer has been removed aside from the gate electrode 16 except at the base/bottom thereof, and has been replaced by the reaction product 28. The reaction product 28 continues to grow in thickness as the reactant gases from the adsorbed reactant film 20 continue to pass through the reaction product 28 to react with the underlying silicon oxide layers 14 and 18.

Figure 1D:
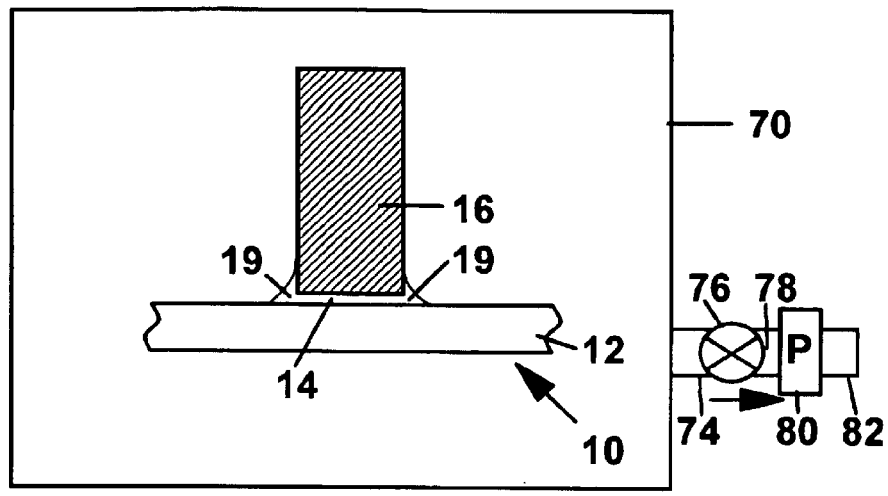

Second, as illustrated in FIG. 1D, the device 10 of FIG. 1C is shown after completion of the precleaning process by removal of reaction product 28 in a heated chamber 70 which includes an exhaust line 74, valve 76, line 78 to pump 80 and an outlet 82. During heating of device 10 in chamber 70, the reaction product 28 is removed (by evaporation at about 100° C. in this case) from the top and the sidewalls of the gate electrode except at the bottom thereof. Thus, the sidewalls of the gate electrode 16 and the surface of the substrate 12 are exposed except near the bottom at the corners between the gate electrode 16 and the substrate 12 where the surfaces of each of the rounded, silicon oxide corners 19 comprise a region of silicon oxide which remains where the remainder of the reoxidation layer 8/gate oxide layer 14 and an oxide formed from the monocrystalline silicon substrate 12 have merged into the rounded silicon oxide corners 19, since they are all composed of silicon oxide.

The solid COR reaction product 28 produces a self-limiting reaction because during the interval between the results shown in FIGS. 1B and 1C the COR reaction product 28 (which as described above was formed below the adsorbed reactant film 20) impedes the diffusion of hydrogen fluoride and ammonia to the reacting surface of oxide layers 14/18. The self-limiting thickness can be tuned by changing the reaction conditions. A higher pressure or lower temperature in chamber 44 increases the self-limiting thickness. Furthermore, the solid reaction product 28 occupies more volume than the silicon oxide of layers 14/18 which are being etched. This means that there is less etching in the rounded, silicon oxide corners 19, as seen in FIG. 1D where the gate oxide 14 and the sidewall oxide 18 have intersected because the reaction products from both surfaces overlap and expand in volume, thereby interfering with etching. Etching is terminated at the rounded, silicon oxide corners 19 before it is terminated in regions where there is no overlapping of reaction product from two adjoining surfaces 18/12. The self-limiting thickness can be tuned by changing reaction conditions and the thickness of the reoxidized sidewall oxide 18 can be altered to give the desired oxide profile at the base of the gate electrode 16.

The length of oxide tailing can be varied from undercut to about three times the thickness of the oxide layers 14/18 which were removed, with a maximum thickness of thermal oxide removal of about 250 Å in a single etching step.

The combination of deposition and the COR etching processes of the present invention offers the advantage of tailoring the interaction between the processes. For example, the interaction between deposition conditions produces a surface of a given configuration provided by COR etch conditions clears away the reoxidized silicon oxide layer 18 from the sidewalls of the gate electrode 16. It also clears away the gate oxide 14 from the surface of the substrate 12 aside from gate electrode 16. As a result, a silicon oxide profile is produced in which the base of gate electrode 16 and the exposed surface of the substrate 12 meet, thereby providing the desired configuration.

In particular, the chemical oxide removal (COR) process is highly selective and self-terminating, thereby enabling controlled removal of thin layers of silicon oxide such as the gate dielectric 14 and the reoxidized silicon oxide layer 18 covering the exterior surfaces of the gate electrode 16 above the gate dielectric 14 to the degree desired and avoiding unintended removal of the gate dielectric 14 at the base/bottom of the gate electrode 16. By contrast, conventional sputtering, RIE and wet etch processes, do not offer the combination of self-termination and high selectivity and thus fail to offer an opportunity for tailoring the interaction between the deposition and the etching processes.

The mixture of reactive gases comprising HF from line 49 and $NH_3$ from line 53 initially forms the adsorbed reactant film 20 on the surface of the silicon oxide layer 18. Preferably, that mixture of reactive gases comprises a combination of HF (hydrogen fluoride) gas introduced through line 47, valve 48 and line 49 into the chamber 44 and ammonia ($NH_3$) gas introduced through line 51, valve 52 and line 53 into the chamber 44 to remove the conformal silicon oxide layer 18 exposing the surface of the crystalline silicon substrate 12, except at the base of the polysilicon gate electrode 16 as seen in FIG. 1C. It is possible to tune the shape of the curved silicon oxide 18 at the base of the polysilicon gate electrode 16 by adjusting the amount of reoxidation, i.e. thickness of the reoxidized layer 18 and the amount of HF and ammonia overetch.

Figure 1E:
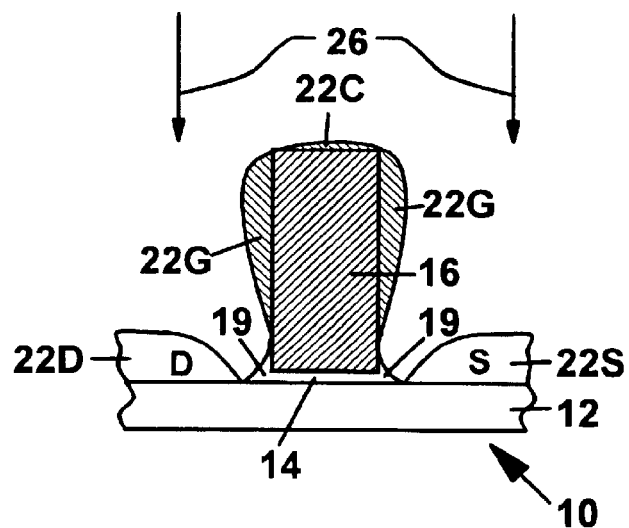

FIG. 1E shows the device 10 of FIG. 1D after selective epitaxial deposition of a layer of silicon (22) only on surfaces of silicon and monocrystalline silicon but not on the surface of the rounded silicon oxide corners 19. Thus, the epitaxial layer of silicon is deposited as a gate encapsulation cap 22C on top of gate electrode 16, as sidewall layers 22G on the exposed sidewall surfaces of the gate electrode 16, and as a set of raised source/drain regions 22D/22S on the exposed surface of the monocrystalline silicon substrate 12. However, the selective epitaxial silicon deposit (22) is not formed on the rounded, silicon oxide corners 19, leaving a gap thereover.

Note that the raised source/drain regions 22D/22S protrude well beyond the exterior surface of the gate oxide layer 14 and the rounded, silicon oxide corners 19.

The portions of the epitaxial silicon deposit, which are formed as in situ doped raised source/drain regions 22D/22S over the substrate 12, are shown as a drain region 22D and a source region 22S having been doped with source/drain dopant, which is indicated as being incorporated precursor molecules during deposition as indicated by the arrows 26. The epitaxial doped silicon has been deposited by employing a conventional selective LTE deposition process with in situ doping thereof for the source/drain regions 22D/22S. In addition, the gate encapsulation layer 22G is also doped to provide a doped polysilicon coating of the gate electrode 16.

Figure 1F:
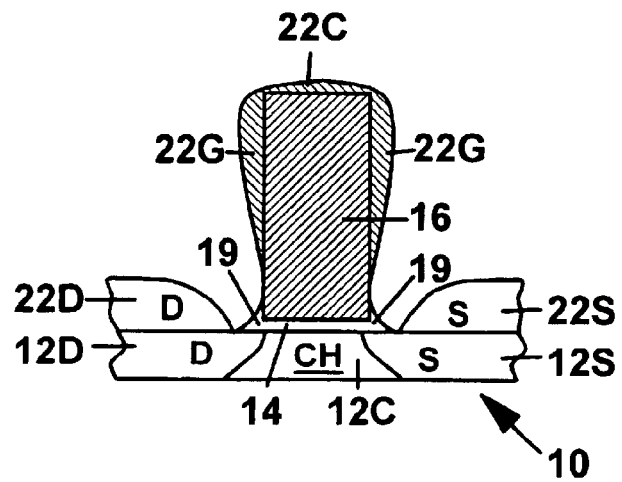

FIG. 1F shows the device 10 of FIG. 1E after the dopant incorporated in drain region 22D and a source region 22S (of the deposited epitaxial silicon) in FIG. 1E has been driven down therefrom into underlying silicon layer of the substrate 12 to form doped source/drain regions 12S/12D therein in order to overlap the gate electrode 16. Those source/drain regions 12S/12D define the left and right sides of a channel region 12C located directly below the gate electrode 16 and the remainder of the gate oxide layer 14. The larger gate size is an advantage when siliciding the structure later in the process sequence.

The NFETs and PFETs are prepared separately by overlying the regions with a blocking layer which can withstand selective epitaxy and exposing the underlying gates with a blockout mask as will be well understood by those skilled in the art of processing with photolithographic masks.

The heat treatment required for driving in dopant following in situ deposition of a doped silicon epitaxial layer is reduced relative to that required for activation of dopant/recrystallization of silicon following an implant so the process does not contribute to the problem of dopant spread.

Although the chemical reactions discussed herein are designed to remove silicon dioxide from silicon, other combinations of sources of chemical materials and other chemical steps can be employed. For instance, a number of different chemistries commonly used with aqueous solutions can be employed in the devices of the present invention designed for accurate etching.

Some of the specific sources include the gaseous vapor from solid ammonium bifluoride a solution of HF, $NH_3$, and $H_2O$; separate sources of HF, $NH_3$, and $H_2O$; separate sources of HF and $NH_3$; a solution of $NH_3/H_2O$ coupled with a gaseous or solution source of HF, and the like. Solvents or solutions other than water can be used, e.g. alcohol can replace water. For another example, the silicon dioxide which forms on many silicides can react with condensed layers containing HF. Oxides other than silicon dioxide react with condensed layers containing HF and $NH_3$ or $H_2O$. An example of that is that experiments have shown that HF vapor chemistries, including the vapor from ammonium bifluoride solid, remove oxides which incorporate germanium. Even pure germanium oxide will react.

There are a several low pressure, or high temperature chemistries which use a source of a solid containing ammonium ions or separate sources containing ammonia and an acid. Ammonia is unique in that ammonia has a high vapor pressure and yet the ammonium ion containing solid which forms upon reaction with an acid is not particularly volatile. Thus, a number of aqueous chemistries which etch films besides oxides show analogous reactions in condensed films containing ammonia. When etching material, it is not necessary to etch a large amount of the material. For instance, removal of trace metal contamination may be achieved by the method of this invention.

Second Embodiment: Formation of Non-Selective Blanket, Epitaxial Layer

FIGS. 2A–2F show an alternative embodiment of the process of this invention is which device 10 is made starting with the device of FIG. 1A.

Figure 2A:
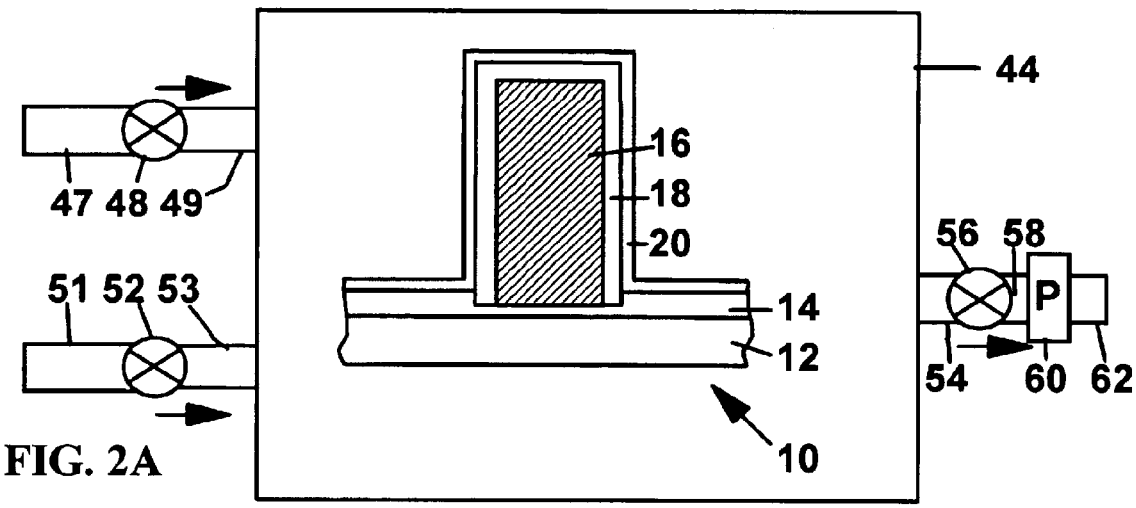
FIGS. 2A–2F show an alternative embodiment of the process of this invention in which a device is made substituting a non-selective blanket, epitaxial layer for the selective epitaxial process of FIGS. 1A–1F.
Figure 2B:
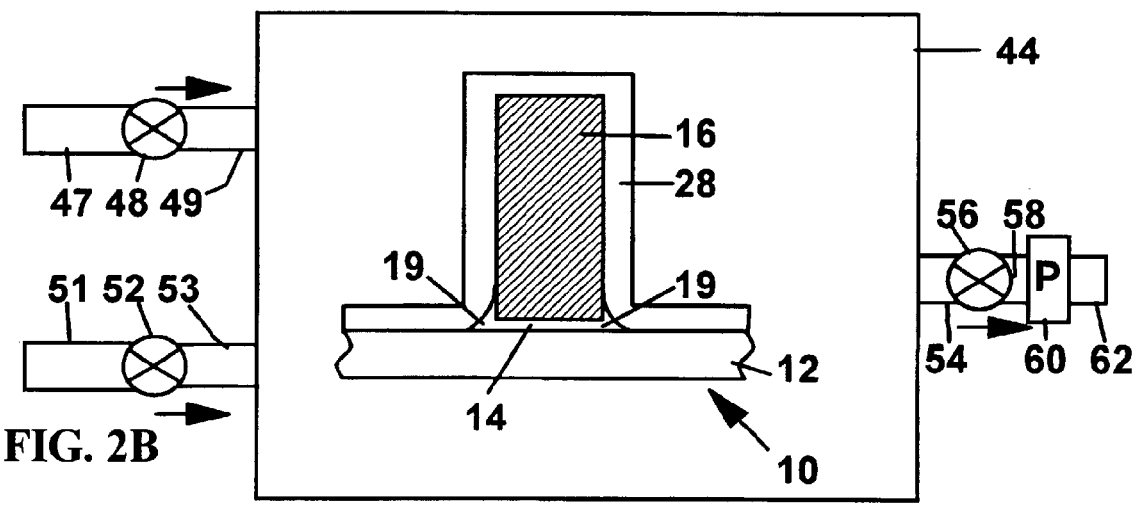
Figure 2C:
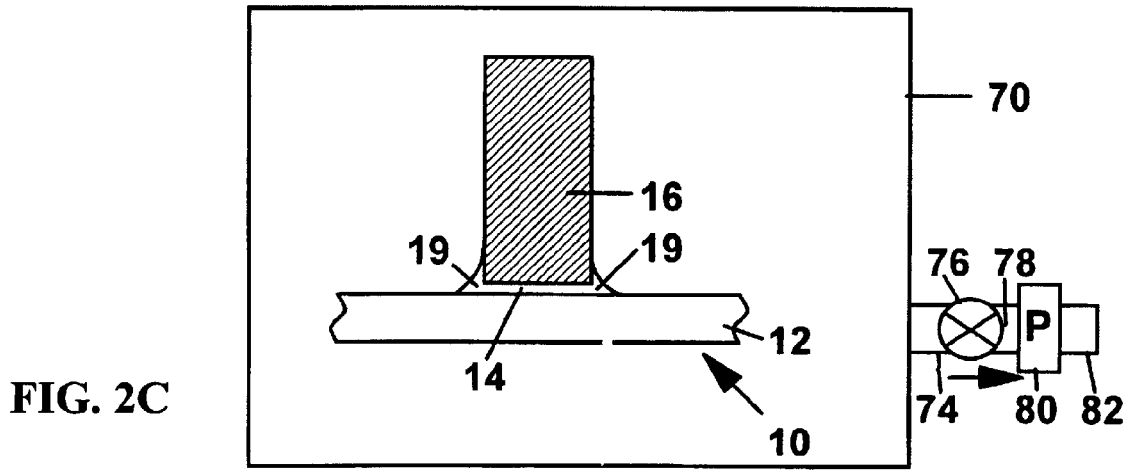
Figure 2D:
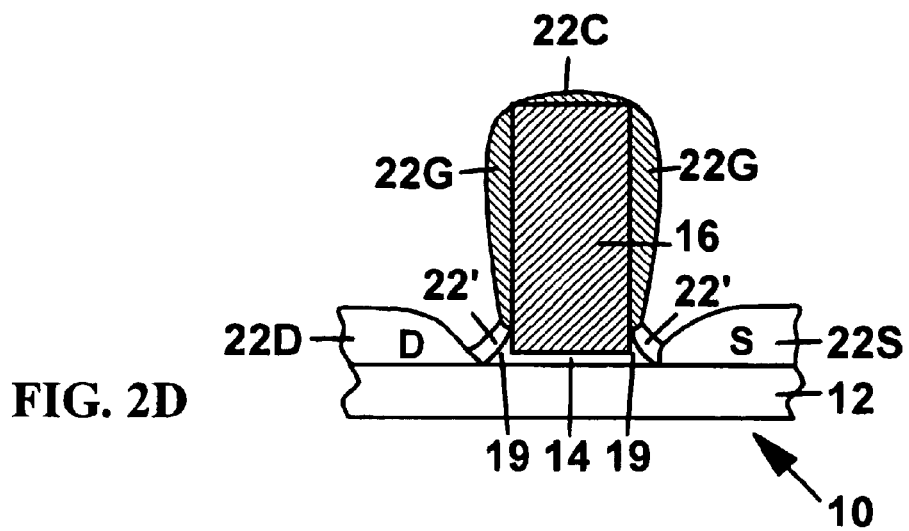

The process starts with the step of FIG. 1A which is not shown for convenience of illustration. The process steps illustrated by FIGS. 2A–2C are identical to the process steps illustrated by FIGS. 1B–1D. The next process step is different as illustrated by FIG. 2D which illustrates the deposition of a non-selective blanket silicon layer that was deposited using a LTE process. FIGS. 2A–2C which are identical to FIGS. 1B–1D illustrate the COR precleaning steps in accordance with this invention. Like reference numbers refer to like elements in FIGS. 1A–1F, performing the same functions unless otherwise specified.

In the step illustrated in FIG. 2D, the process of non-selective, blanket, epitaxial deposition of silicon forms epitaxially deposited silicon forming the same layers as in FIG. 1E plus the temporary formation of the additional, laminated, non-epitaxial silicon segments 22'. The temporary non-epitaxial segments 22' are formed over the rounded, silicon oxide corners 19. If the temporary laminated segments 22' were to remain, short circuits could be created therethrough between the source/drains 22D/22S and the gate electrode 16 via the sidewall silicon 22G coated thereon. The thickness of the laminated non-epitaxial silicon segments 22' is less than the thickness of source/drain regions 22D/22S in the epitaxial area.

Note that the raised source/drain regions 22D/22S protrude well beyond the exterior surface of the gate oxide layer 14 and the rounded, silicon oxide corners 19 and the temporary, laminated, non-epitaxial silicon segments 22'.

Figure 2E:
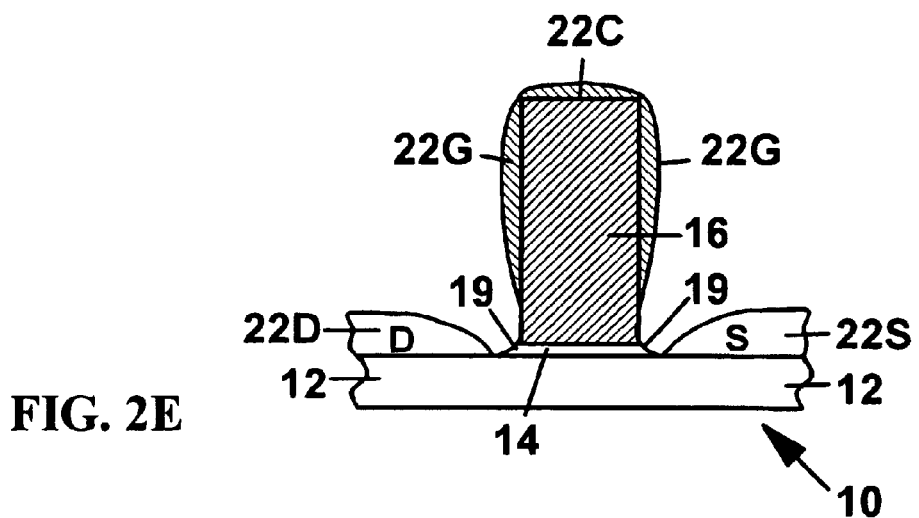

FIG. 2E shows the device 10 of FIG. 2D after an isotropic etch-back of the exposed silicon by a process such as oxidation, optionally followed by a process of stripping silicon oxide. As a result, the temporary, laminated, non-epitaxial segments 22' have been removed and the raised source/drains 22D/22S have been reduced in thickness and polysilicon layers 22G formed on the sidewalls and cap of gate electrode 16 are reduced in thickness slightly, with the result that unwanted, laminated, non-epitaxial silicon segments 22' have been removed thereby curing the potential short circuit problem of FIG. 2D.

The potential short circuit problem is cured because even if the isotropic etch-back removes silicon from non-epitaxial silicon segments 22' at the same rate as from source/drain regions 22D/22S, the reduced thickness of non-epitaxial silicon segments 22' means that it will be removed while some of the thicknesses of the source/drain regions 22D/22S remain.

Figure 2F:
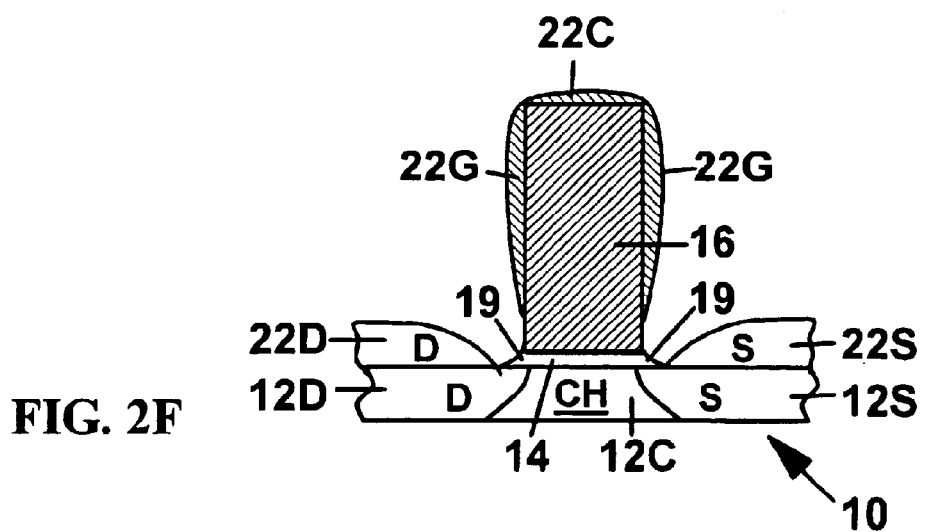

FIG. 2F shows the same result as in FIG. 1F after dopant in the raised source/drain regions 22D/22S was driven into lower source/drain regions 12S/12D in the substrate 12 forming the channel (CH) 12C therebetween in substrate 12, below the gate electrode 16 and the gate dielectric 14. As in the case of the process of FIG. 1F, the heat treatment required to drive dopant into the lower source/drain regions 12S/12D following in situ deposition of a doped silicon epitaxial layer is less relative to that required to activate dopant/recrystallization of silicon after an implant so the process does not cause the problem of dopant spread.

It is an option that the drive-in anneal can precede or follow the oxidation step for removal of silicon segments 22'.

Third Embodiment

FIGS. 3A–3F show an alternative to the process of FIGS. 1A–1F in which a device 10 is made by the process of FIGS. 1A–1F except that the reoxidation step shown in FIG. 1B is omitted when forming the silicon oxide layer 18 over the gate electrode 16 and thickening of the silicon oxide of the gate dielectric layer 14.

Figure 3A:
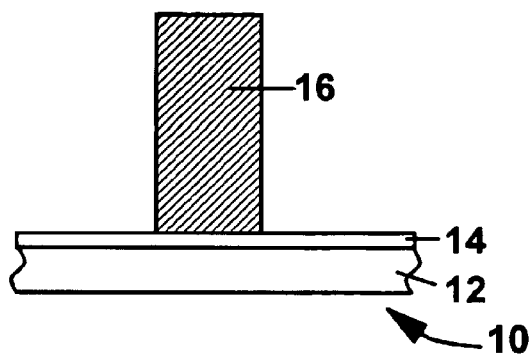
FIGS. 3A–3F show an alternative embodiment to the process of FIGS. 1A–1F in which a device is made by the same process as in FIGS. 1A–1F except for omission of the step shown in FIG. 1B.

FIG. 3A shows device 10 after formation of the gate electrode 16 over the gate dielectric layer, shown again as a gate oxide layer 14 resting on semiconductor substrate 12 after the process steps described in connection with FIGS. 1A and 1B (other than the reoxidation step). Like reference numbers refer to like elements in FIGS. 1A–1F and other previous drawings and perform similar functions unless otherwise specified. As there was no reoxidation step, surfaces of gate electrode 16 remain exposed and the gate oxide layer 14 is of uniform thickness.

Figure 3B:
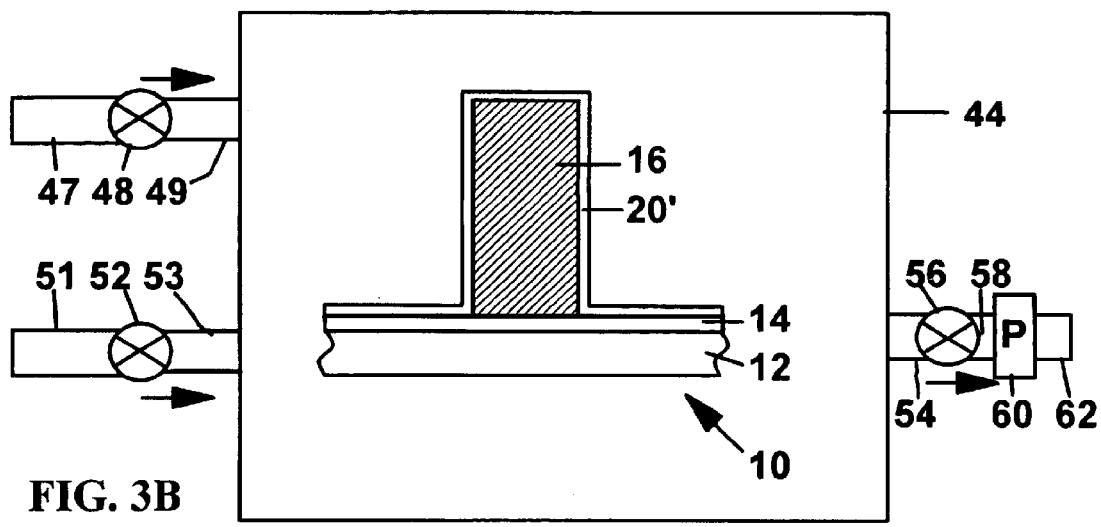

FIG. 3B illustrates the process of introducing COR gases via lines 49/53 into COR chamber 44 to form a COR adsorbed reactant film 20' in chamber 44, as described above over the entire exposed surface of gate electrode 16, which in this case includes the entire surfaces of the top and the sidewalls of the gate electrode 16 as well as the exposed surface of the gate oxide layer 14 which blankets substrate 12.

Figure 3C:
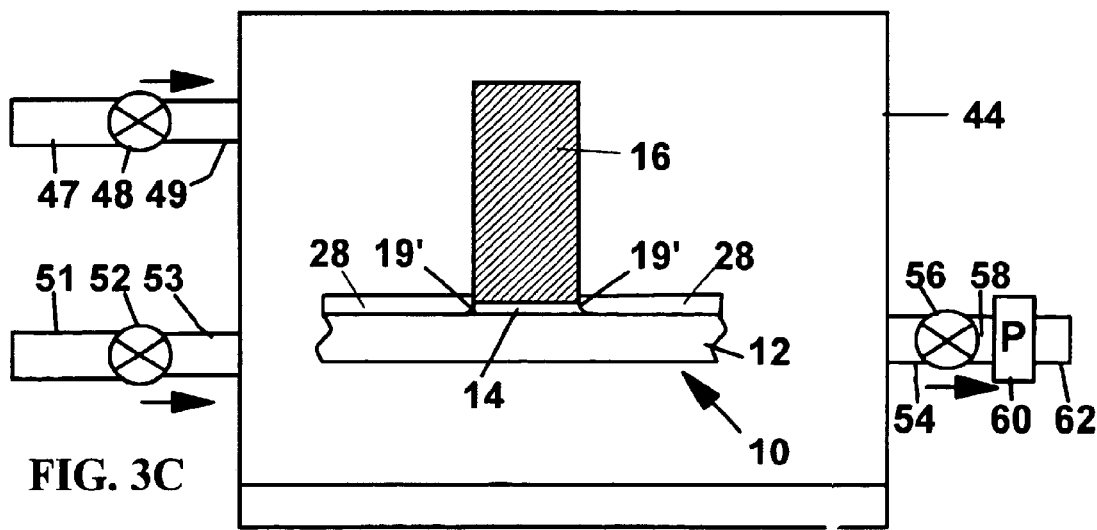

FIG. 3C shows the device 10 of FIG. 3B in the COR chamber 44 after the first stage of the COR process has been partially completed as in FIG. 1C with the adsorbed reactant film 20' from the HF and $NH_3$ gases having reacted with the portions of the surface of the gate oxide layer 14 in contact therewith to form a condensed, solid COR reaction product 28 in place of the exposed surfaces of the silicon oxide of the gate oxide layer 14. The remainder of the gases evolved from the adsorbed reactant film 20' have been exhausted through exhaust line 54, valve 56, pump 60 and outlet line 62. In other words, the exposed surfaces of the gate oxide layer 14 have been converted to the reaction product 28, as described above. At the corners between the gate electrode 16 and the substrate 12 there are very narrow rounded, silicon oxide corners 19' at the interface between the reaction product 28 and the remainder of the gate oxide layer 14.

Figure 3D:
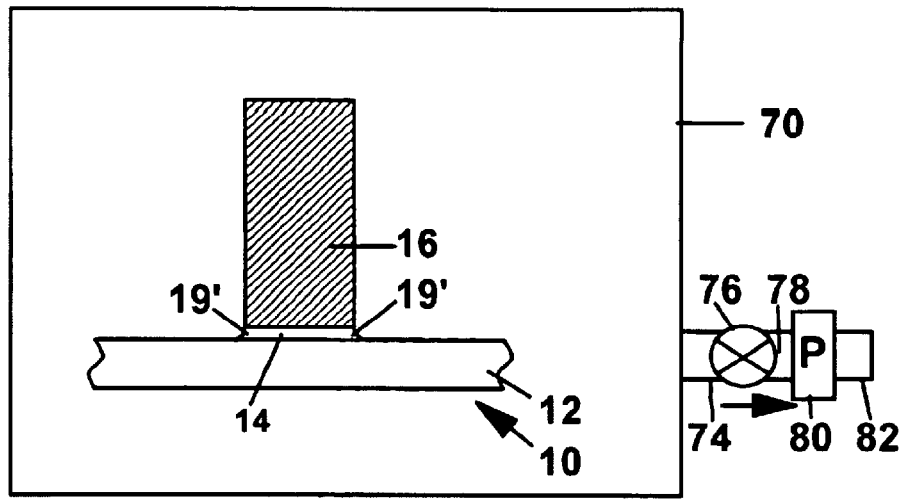

FIG. 3D shows the device 10 of FIG. 3C after placing device 10 of FIG. 1C in a heated chamber 70, as illustrated in FIG. 1D. In other words, the process of removal of reaction product 28 has been completed in the chamber 70 including exhaust line 74, valve 76, line 78 to pump 80 and an outlet 82. While heating device 10 in chamber 70, the reaction product 28 is removed (by evaporation at about 100° C. in this case). In this embodiment the sidewalls of the gate electrode 16 and the surface of the substrate 12 had been exposed. At the corners between the gate electrode 16 and substrate 12, the rounded, silicon oxide corners 19' remain.

In summary, FIG. 3D shows that the exposed portion of gate oxide layer 14 has been etched away by the COR etching process. In this case the surface of the very narrow, rounded corners 19' are located at and below the lower level of the gate electrode 16 down to the exposed surface of substrate 12. As a result, substrate 12 is now exposed aside from the gate electrode 16 as in FIGS. 1D and 2C above, except for the space filled by the narrow rounded corners 19'.

Figure 3E:
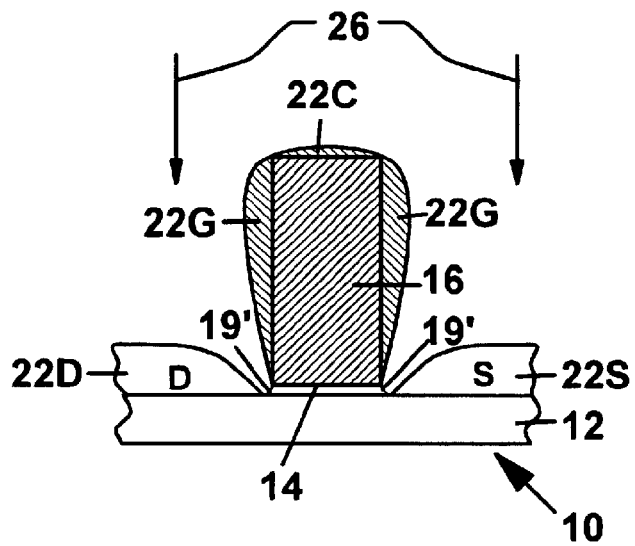

FIG. 3E shows the device 10 of FIG. 3D after selective epitaxial deposition of silicon only on surfaces of silicon and monocrystalline silicon but not on the silicon oxide 14. Thus, the epitaxial silicon is deposited (as in FIG. 1E) only on the exposed top and sidewall surfaces of the gate electrode 16 as well as a set of source/drain regions 22D/22S on the exposed surface of the monocrystalline silicon substrate 12. However, the epitaxial silicon deposit is not formed on the narrow, rounded, silicon oxide corners 19' at the borders of the gate oxide layer 14, leaving a gap thereover which is only slightly greater in width than the thickness of the gate oxide layer 14.

Note that the raised source/drain regions 22D/22S protrude well beyond the exterior surface of the gate oxide layer 14 and the narrow, rounded corners 19'.

The portions of the epitaxial silicon deposit, which are formed as in-situ doped raised source/drain regions 22D/22S over the substrate 12, are shown as a drain region 22D and a source region 22S having been doped with source/drain dopant, which is indicated as being doped in situ by the arrows 26. The epitaxial doped silicon has been deposited by employing a conventional selective LTE deposition process with in situ doping thereof for the raised source/drain regions 22D/22S.

In addition, the doped polysilicon, gate encapsulation layer 22G is also doped to provide a doped polysilicon coating of the gate electrode 16. In this case the raised source/drain regions 22D/22S have greater proximity to the gate electrode 16 because of the narrowness of the rounded, silicon oxide corners 19' of silicon oxide provided by the spacing along the rounded, silicon oxide corners 19' which are only slightly greater in width than the thickness of the gate oxide layer 14.

Figure 3F:
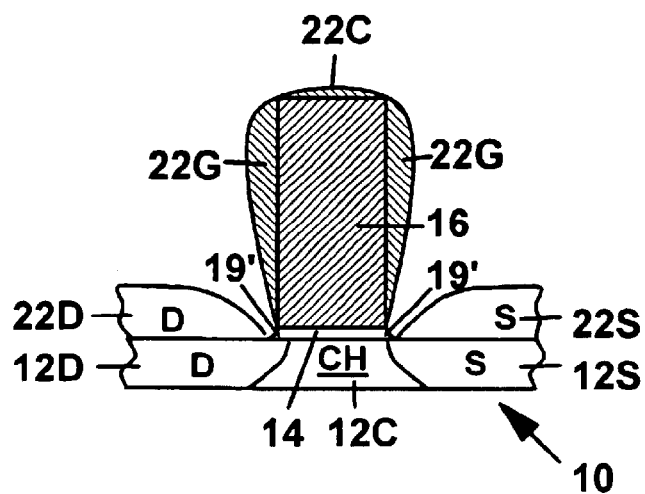

FIG. 3F shows the device 10 of FIG. 3E with the same result as in FIGS. 1F and 2F after the dopant in the raised source/drain regions 22D/22S has been driven down into the lower source/drain regions 12S/12D in the substrate 12 forming the CH channel 12C therebetween in the substrate 12 below the gate electrode 16 and the gate dielectric 14. As in the case of the process of FIGS. 1F and 2F, the heat treatment required for driving in dopant following in situ deposition of a doped silicon epitaxial layer is reduced relative to that required for activation of dopant/recrystallization of silicon following an implant so the process does not contribute to the problem of dopant spread.

The embodiment of FIGS. 3A–3F is particularly well suited to use with a device having a metal gate electrode 16 since the step of reoxidation of the gate electrode is not employed. It may not be possible to reoxidize certain metals or to remove certain oxides thereof with the COR process of this invention. Accordingly that problem is overcome by the embodiment of FIGS. 3A–3F.

Figure 4A:
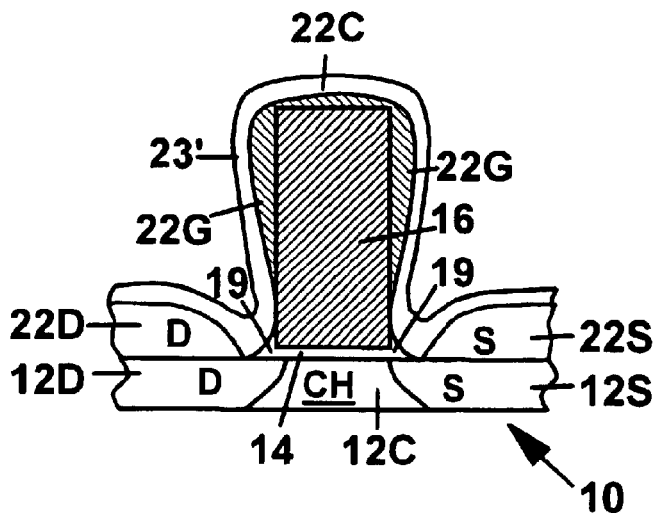
FIGS. 4A–4C show a series of steps performed on the product of FIG. 2D which was formed using a non-selective epitaxial process.
Figure 4B:
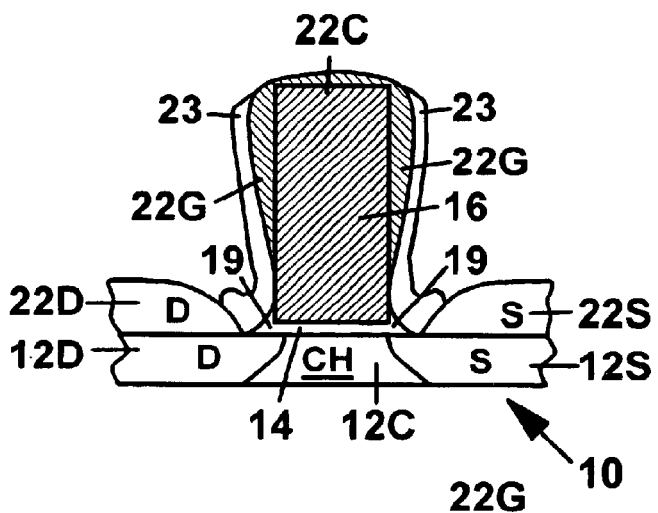
Figure 4C:
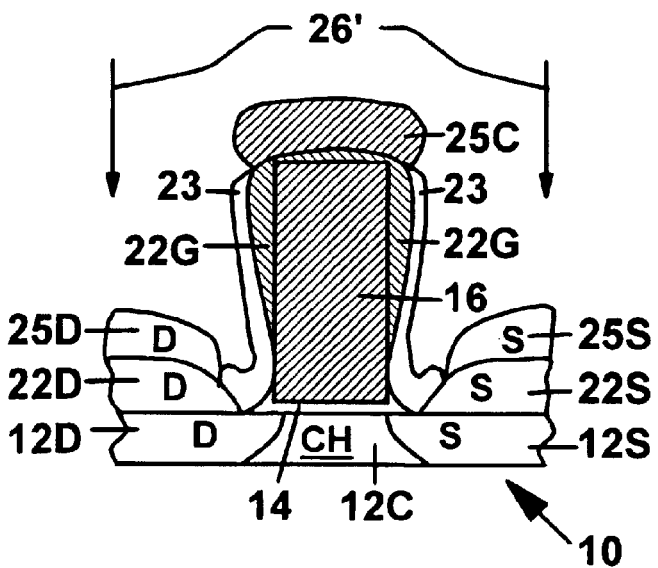

Fourth Embodiment: Non-Selective Epitaxial, Double-Laminated, Raised Source/Drain FIGS. 4A–4C show a series of steps performed on the product of FIG. 2D to form a non-selective epitaxial, double-laminated raised device 10. Double lamination is advantageous when a set of thicker raised source/drain regions are required than can be deposited in a single pass without gate to source/drain short circuits to a significant extent.

FIG. 4A shows the device 10 of FIG. 2D after the silicon segments 22' and portions of source/drain regions 22D/22S, sidewall silicon 22G and silicon cap 22C are consumed by thermal oxidation to form a blanket silicon oxide layer 23' covering device 10 and to remove gate to source/drain shorts caused by silicon segments 22'. Oxidation is sufficient to carry out the following etch back, but not sufficient to impact current detrimentally to a significant extent.

FIG. 4B shows the device of FIG. 4A after the blanket silicon oxide layer 23' has been anisotropically etched back by RIE to remove the horizontal portions thereof leaving only the remainder 23 of layer 23' on the sidewalls of the gate electrode 16/22G. In other words, the RIE etch back removes the part of layer 23' which had covered the upper surfaces of the raised source/drain regions 22S/22D and the cap 22C of the doped polysilicon gate encapsulation layer 22G.

FIG. 4C shows the device of FIG. 4B after selective epitaxial deposition of a polysilicon cap 25C over the cap 22C over the exposed cap of the doped polysilicon gate encapsulation layer 22G and forming double laminated layers comprising raised source/drain regions 25S/25D over the raised source/drain regions 22S/22D which are doped in situ.

In summary, FIG. 4C shows the source/drain regions 12S/12D formed in the substrate 12 plus double laminated epitaxial, raised source/drain regions 25S/25D formed over the raised source/drain regions 22S/22D.

Fifth Embodiment: Selective Epitaxial, Double-Laminated Raised Source/Drain

Figure 5A:
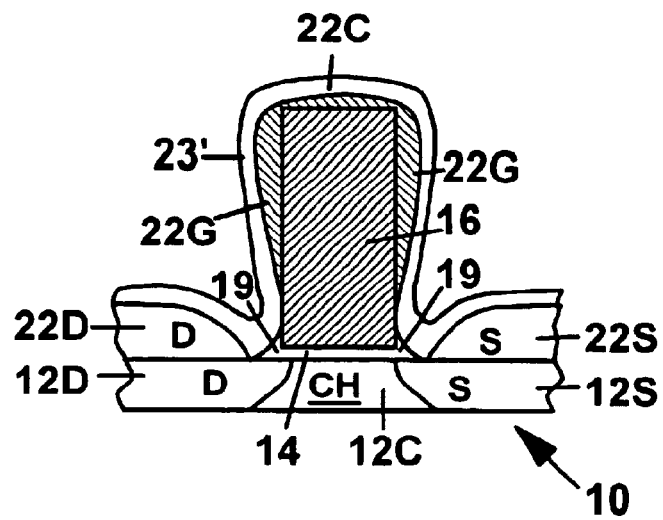
FIGS. 5A–5C show a series of steps performed on the product of FIG. 1F which was formed using a selective epitaxial process.
Figure 5B:
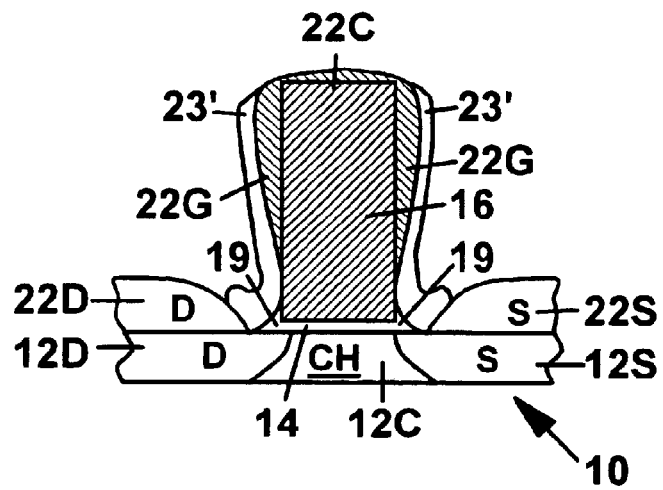
Figure 5C:
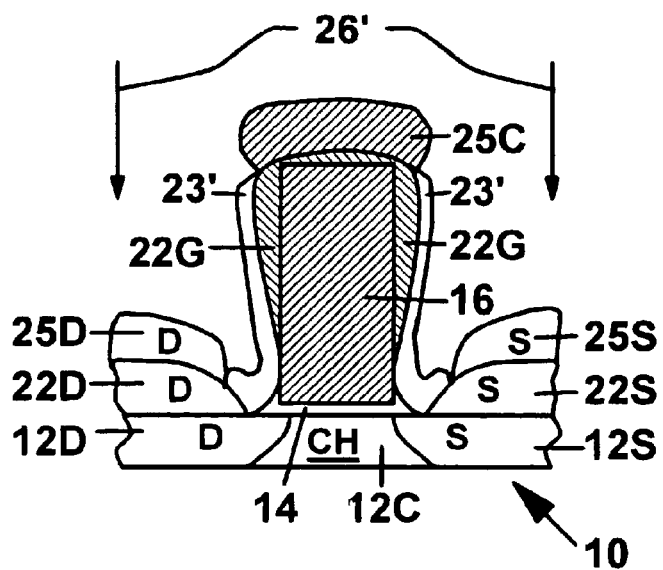

FIGS. 5A–5C show a series of steps performed on the product of FIG. 1F which was formed by a selective epitaxial process. The steps form a double-laminated raised device 10.

FIG. 5A shows the device of FIG. 1F after a blanket insulation layer 23' was deposited by CVD. The insulation layer 23' reaches down into the grooves defined above the rounded corners 19, covering the gate electrode 16/22G structure and the raised source/drain regions 22S/22D. However, there is no consumption of silicon as was possible in the previous embodiment which employed thermal oxidation.

FIG. 5B shows the device of FIG. 5A after the blanket insulation layer 23' has been anisotropically etched back by RIE removing the horizontal portions thereof leaving only the remainder 23 of layer 23' on the sidewalls of the gate electrode structure 16/22G. In other words, the RIE etch back removes the part of layer 23' which had covered the upper surfaces of the raised source/drain regions 22S/22D and the cap 22C of the doped polysilicon gate encapsulation layer 22G. It will be well understood by those skilled in the art that two layers 23' could be deposited such as a thermally grown or CVD silicon oxide followed by a silicon nitride layer.

FIG. 5C shows the device of FIG. 5B after selective epitaxial deposition of polysilicon cap 25C over the cap 22C of doped polysilicon gate encapsulation layer 22G and forming double raised source/drain regions 25S/25D over raised source/drain regions 22S/22D which are doped in situ. Thus source/drain regions in the substrate 12 are covered by double laminated raised source/drain regions. Note that each lamination is epitaxial.

In summary, FIG. 5C shows the source/drain regions 12S/12D formed in the substrate 12 plus double laminated epitaxial, raised source/drain regions 25S/25D formed over the raised source/drain regions 22S/22D.

Figure 6A:
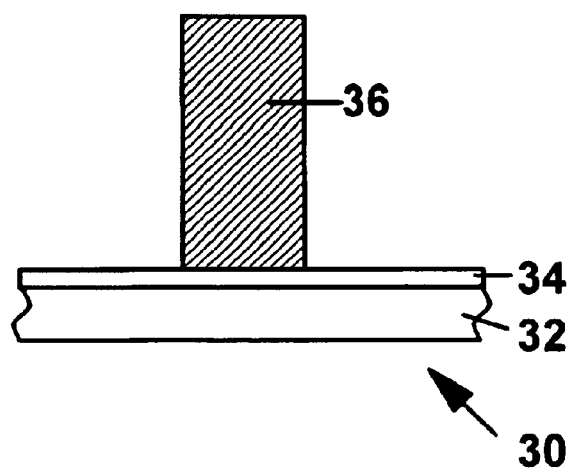
FIGS. 6A–6I show an alternative embodiment of the invention in which the initial processing steps are the same as those performed in FIGS. 1A–1F with the addition of a collar over the reoxidized layer as shown in FIG. 6C.
Figure 6B:
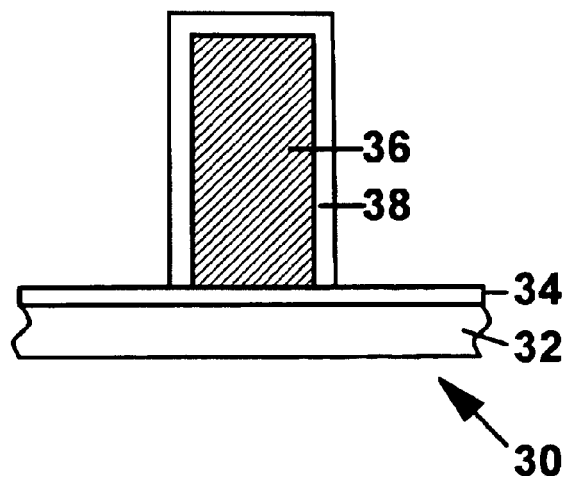
Figure 6C:
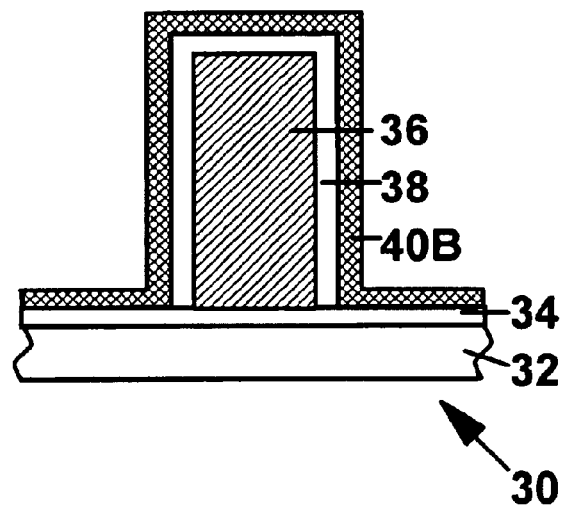

FIGS. 6A–6I show an alternative embodiment of the invention wherein the initial processing steps are the same as those in FIGS. 1A–1F with the addition of forming a collar 40 over the reoxidized layer as shown in FIG. 6C. In particular, a gate oxide layer 34 is formed over a monocrystalline silicon substrate 12. A gate electrode 36 formed of doped polysilicon is formed over the gate oxide layer 34.

In FIG. 6B a blanket reoxidized layer 38 is formed on the surface of the gate electrode 36.

In FIG. 6C an ultrathin silicon nitride layer 40B is deposited covering the sides of the reoxidized oxide layer 38.

Figure 6D:
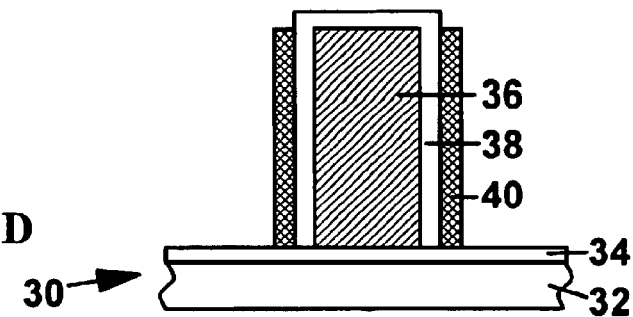

In FIG. 6D layer 40B has been anisotropically etched back by RIE to form a collar (sidewall) 40 on the reoxidized layer 38.

Figure 6E:
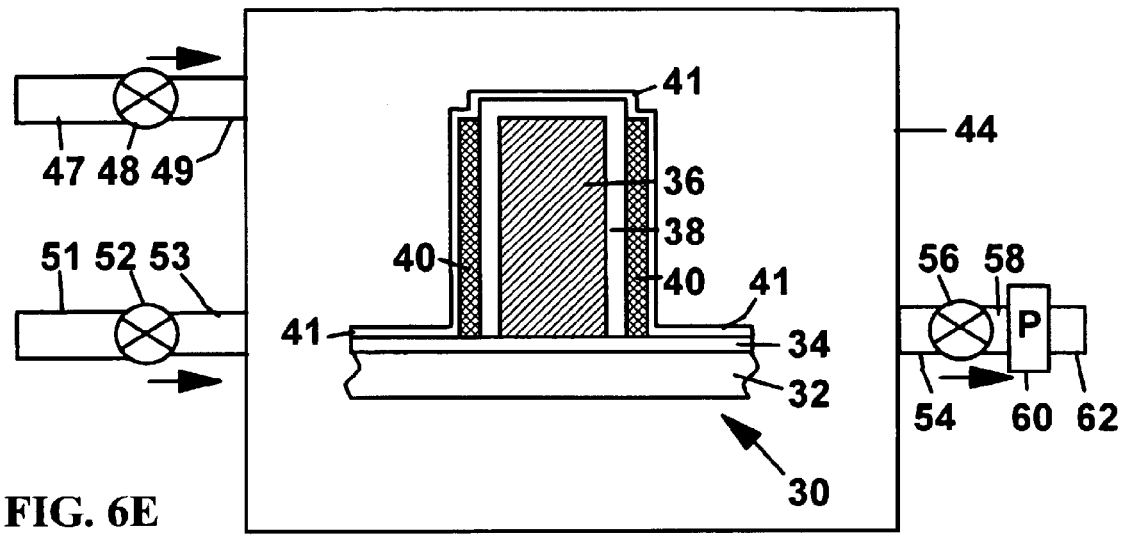
Figure 6F:
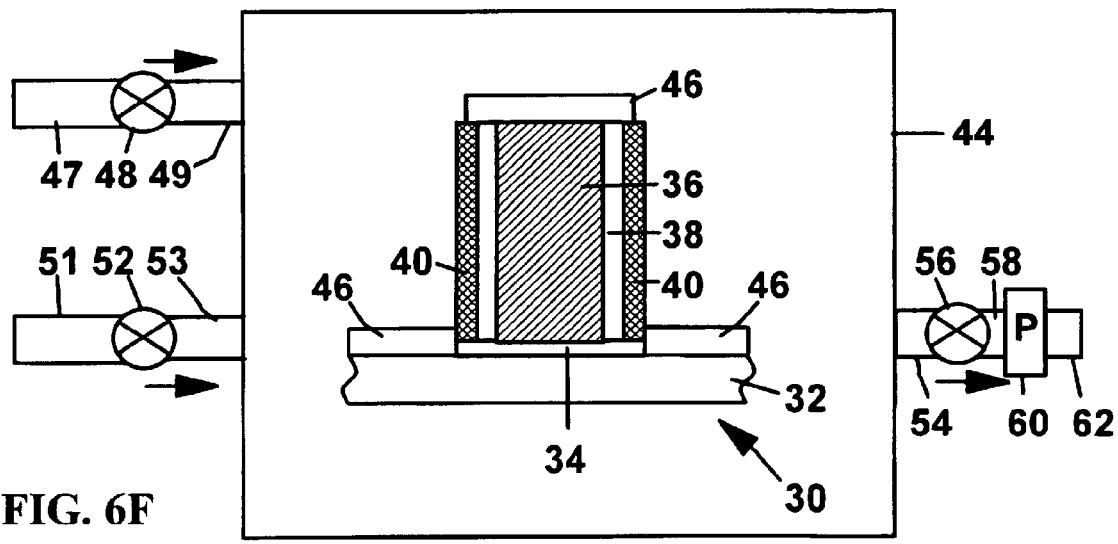

Then the COR process is employed in FIGS. 6E and 6F to remove the silicon oxide layer 38 from the top of the gate electrode 36 and the gate oxide from the surface of the silicon substrate 32 aside from the gate electrode stack 36/38/40.

Figure 6G:
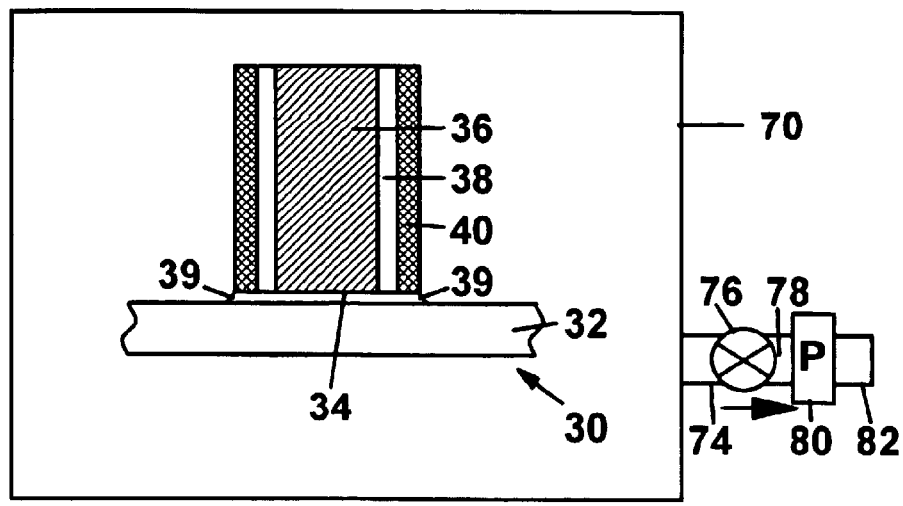

Then in FIG. 6G a non-selective epitaxial deposition was performed with in situ doping forming raised source/drain regions 42S/42D on the substrate 32.

Figure 6H:
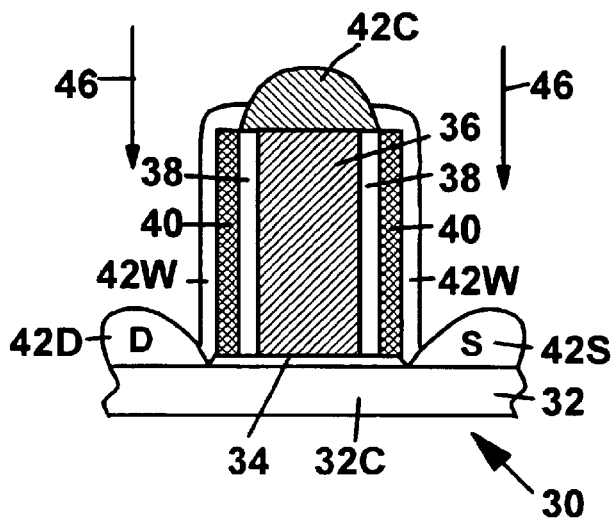

In FIG. 6H, the source/drain regions 32S/32D have been formed in the silicon substrate 32 by driving in dopant from the raised drain source regions 42S/42D.

In more detail, FIG. 6A shows the device 30 in an intermediate stage of processing. The device 30 includes a conductor comprising a conventionally doped polysilicon gate electrode 36 formed on a thin film, gate dielectric 34 (such as a gate silicon oxide) which is deposited upon a single crystal semiconductor substrate 32 which may be a bulk layer or a thin film layer of a semiconductor, such as doped silicon. The gate electrode 36 has been patterned by a conventional process such as a polysilicon RIE (Reactive Ion Etching) process employing photolithography as will be well understood by those skilled in the art of MOSFET fabrication processes.

FIG. 6B shows device 30 of FIG. 6A after sidewall reoxidation has been performed to create the a conformal, reoxidized silicon oxide layer 38 covering the external surfaces of the polysilicon gate electrode 36 with greater growth on the sidewalls of the polysilicon gate electrode 36 than on the surface of the gate dielectric 34.

FIG. 6C shows the device 30 of FIG. 6B after formation of a nitride "collar" layer 40B, preferably composed of a blanket layer of silicon nitride covering the device 30 including the tops and the sidewalls of the reoxidized silicon oxide layer 38 as well as the gate oxide layer 34.

FIG. 6D shows the device 30 of FIG. 6C after a collar (sidewall) 40 has been formed from the barrier layer 40B on the sidewalls of the gate electrode 36 by removing the horizontal surfaces of the barrier layer 40B with a process such as anisotropic RIE of the silicon nitride 40B, exposing the horizontal surfaces of the gate oxide layer 34 and exposing the top surface of the reoxidized oxide layer 38 exposed at the top of the gate electrode 36, leaving the sidewalls of the reoxidized silicon oxide layer 38 protected by the collar 40.

FIG. 6E shows the device 30 of FIG. 6D after introduction thereof into a Chemical Oxide Removal (COR) processing chamber 44 in which a COR process uses gas phase reactants to form a self-limiting etch that is adjustable by controlling the parameters in the chamber 44. As stated above, the COR etching process of this invention preferably comprises a vapor phase chemical oxide removal process in which combined vapors of HF and $NH_3$ are used as the etchant and carried out under low pressures (10 millitorr or below) are preferred.

A first reservoir (not shown for convenience of illustration) connected to line 47 is filled with a first reactant comprising HF vapor and a second reservoir (not shown for convenience of illustration) connected to line 51 is filled with a second reactant comprising $NH_3$ vapor. Valve 48 connects from line 47 through line 49 to an open inlet to the chamber 44 for admission of HF vapor into chamber 44. Similarly, the valve 52 connects from line 51 through line 53 to an open inlet to the chamber 44 for admission of $NH_3$ vapor into chamber 44. Exhaust line 54 connects through exhaust valve 56 to line 58 to the exhaust pump 60 which pumps exhaust gases to outlet line 62 for removal of gases from the chamber 44. As shown in commonly assigned U.S. Pat. No. 5,282,925 for "Device and Method for Accurate Etching and Removal of Thin Film" of Jeng et al. a microbalance and a mount may be used in the process, and the description is incorporated herein by reference since those elements are not shown for convenience of illustration.

In the preferred mode of operation, the exhaust valve 56 to the vacuum pump 60 is open during admission of the first and second reactant gases into the chamber 44 after opening of valves 48/52. In operation, a COR adsorbed reactant film 41 is caused to adsorb upon the exposed silicon surfaces of the device 30 when the valves 48 and 52 are opened.

Preferably valves 48 and 52 open rapidly and simultaneously. The first and second reactants fill the chamber rapidly and the two reactants adsorb rapidly forming the COR adsorbed reactant film 41 which remains on the exposed surface of the device 30 for a short period of time when the pressure of $NH_3$ and HF is near the vapor pressure at the temperature of the device 30, so that the COR adsorbed reactant film 41 is formed and reactions with the respective surfaces of the reoxidized silicon oxide layer 38 and gate dielectric layer 34 to be etched are initiated.

As stated above, the HF and $NH_3$ reaction with silicon dioxide is a multiple step process.

First, as illustrated in FIG. 6F, the adsorbed reactant film 41 from the HF and $NH_3$ gases has reacted with the portions of reoxidized layer silicon dioxide layer 38 in contact therewith and the portions of the surface of the gate oxide layer 34 in contact therewith to form a solid COR reaction product 46 thereon beneath the adsorbed reactant film 41. The film 41 continues to reform from adsorbing of the HF and $NH_3$ gases on the surface of the reaction product 46 so long as a sufficient vapor pressure of the reactant gases (HF and $NH_3$) remains in the chamber 44. Thereafter, the adsorbed reactant film 41 disappears as shown in FIG. 6F.

The result of the process occurring between FIGS. 6E and 6F is that the reoxidation layer 38 has been removed from the top of the gate electrode 36 and the gate oxide layer has been removed aside from the gate electrode 36 except at the base/bottom thereof, and has been replaced by the reaction product 46. The reaction product 46 continues to grow in thickness as the reactant gases from the adsorbed reactant film 41 continue to pass through the reaction product 46 to react with the underlying silicon oxide layers 34 and 38.

In summary, the reoxidation layer 38 has been removed from the top of the gate electrode 36, but in this case remains intact along the sidewalls of the gate electrode 36. That is to say that the sidewalls of the gate electrode 16 are protected down to the bottom at the corner between the gate electrode 16 and the substrate 12, so in this case the rounded corner of the silicon oxide extends slightly laterally from the collar 40.

Completion of the etching/removal of the amount of the gate dielectric layer 34 and the reaction product 46 at the top of the gate electrode 36 is the second step. That step is illustrated in FIG. 6G where the device 30 of FIG. 6F is shown after completion of a process for removal of reaction product 46 in a heated chamber 70 which includes an exhaust line 74, exhaust valve 76, line 78 to exhaust pump 80 and an outlet 82. During heating of device 10 in chamber 70, the reaction product 46 is removed (by evaporation at about 100° C. in this case) from the top and the sidewalls of the gate electrode 36, except at the bottom thereof. Thus, the sidewalls of the gate electrode 36 and the surface of the substrate 32 are exposed except near the bottom at the corner between the gate electrode 36 and the substrate 32 where the surface of a rounded corner 39 comprising a silicon oxide region remains where the remainder of the reoxidation layer 38/gate oxide layer 34 and an oxide formed from the monocrystalline silicon substrate 32 have merged into the rounded corner 39 since they are all composed of silicon oxide.

Alternately, an aqueous solution of HF can be used for removing the layer 46 in this embodiment.

FIG. 6H shows the device 30 of FIG. 6G after, in this case, a non-selective deposition of an epitaxial silicon layer 42C on the exposed top surface (cap) of the gate electrode 36, an amorphous layer 42W on the silicon nitride barrier layer 40 and an epitaxial layer of raised drain source regions 42D/42S on the exposed surface of the monocrystalline silicon substrate 32. The epitaxial doped silicon layer 42C/42W/42D/42S was formed by employing a conventional selective LTE deposition process. In this case the epitaxial silicon layer 42W/42D/42S has been doped with source/drain dopant, by in situ growth and/or implantation as indicated by ion implantation arrows 46.

Note that the epitaxial silicon layer 42C/42W/42D/42S includes a polycrystalline rounded cap 42C over the gate electrode 36, a layer of amorphous silicon 42W on the sidewalls of the silicon nitride barrier layer 40, plus a monocrystalline, raised drain region 42D and a monocrystalline, raised source region 42S to the left and right of the gate electrode stack. While there is a gap between the raised source/drain regions 42S/42D and the gate electrode 36, there is a temporary short circuit provided by the layer of amorphous silicon 42W on the sidewalls of the silicon nitride barrier layer 40 which needs to be removed to form a completed FET device 30.

Figure 6I:
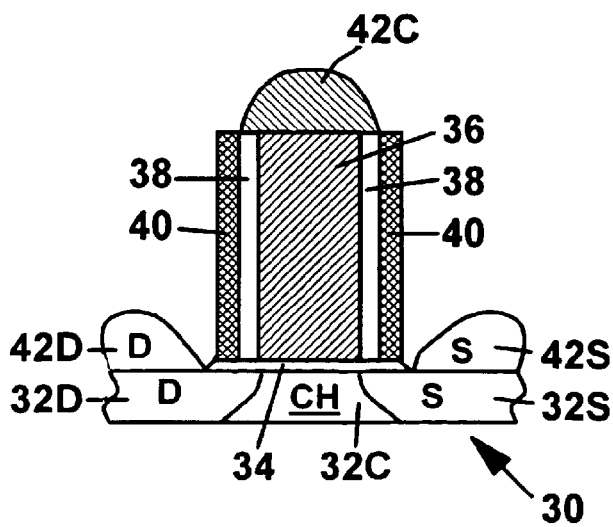

FIG. 6I shows the device 30 of FIG. 6H after the dopant 46 shown in FIG. 6H was implanted into the raised drain region 42D, and the raised source region 42S (deposited layer 42) in FIG. 6G has been driven down from the raised source/drain regions 42S/42D into underlying silicon regions of the substrate 32 to form doped source/drain regions 32S/32D therein, in order to overlap the gate electrode 36. The source/drain regions 32S/32D define either side of a CH channel region 32C below gate electrode 36 and the remainder of the gate oxide layer 34. In addition, the thin layer of epitaxial silicon 42W has been removed from the sidewalls of the device 30 removing the short circuit between the source/drain regions and the cap 42C of the gate electrode 36 by a process such as that described below.

The larger gate size is an advantage when siliciding the structure later in the process sequence.

As stated above the processing steps illustrated by FIG. 6I also include removal of amorphous silicon layer 42W from the collar 40 on the sidewalls. The process preferably includes a silicon oxidation or HIPOX step which converts amorphous layer 42W into silicon oxide thereby removing the short circuits and which oxidizes the single crystal raised source and drain regions 42S/42D and the surface of the polysilicon cap 42C. The silicon oxide (not shown for convenience of illustration) was then etched away. However, the deposited silicon is thicker over the raised source/drain regions than over the ultrathin amorphous layer 42W over the silicon nitride insulator layer 40. Therefore shorts are removed while retaining the raised source/drain regions 42S/42D of in situ doped silicon over the source/drain regions 32S/32D in the substrate 32. It is an option that the drive-in anneal can precede or follow the oxidation step.

The NFETs and PFETs are prepared separately by overlying the regions with a blocking layer and exposing the underlying gates with a blockout mask.

Figure 7A:
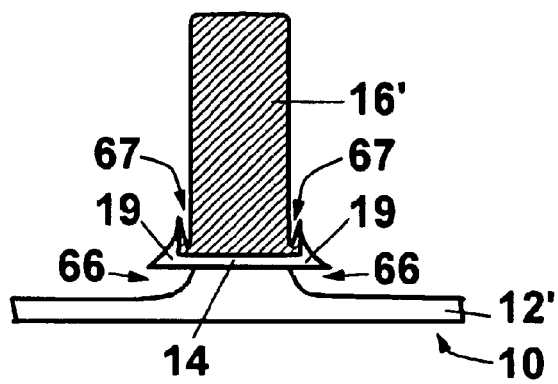
FIG. 7A shows the structure of FIG. 1D after an isotropic silicon etch forming a recess under a cantilevered mask formed by a rounded oxide corner and the gate oxide layer which protects a portion of the substrate.
Figure 7B:
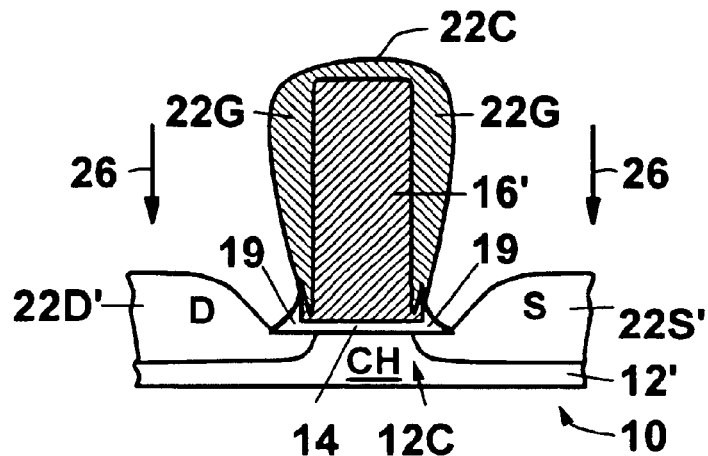
FIG. 7B shows the device of FIG. 7A after performing an in-situ doped LTE deposition process to deposit silicon as in FIG. 3E to form a silicon layer on the gate electrode 1 and the epitaxial source/drain regions over the remainder of the substrate.

In another preferred embodiment illustrated by FIGS. 7A–7B, even the thermal treatment needed for dopant drive-in to form overlap between the overlying gate and underlying source/drain dopant is eliminated. FIG. 7A shows the structure of FIG. 1D after an isotropic silicon etch such as an aqueous solution of a base such as ammonia, an aqueous or acetic acid solution of HF and $HN_3$, or after Chemical Downstream Etching (CDE) resulting from a chlorine plasma has etched down into the substrate 12 of FIG. 1D forming an etched substrate 12' with recesses 66 in the surface thereof, aside from the narrow rounded dielectric corners 19 of the gate dielectric layer 14 and undercutting the substrate 12' below the narrow, rounded corners 19. Thus the recesses 66 extend below the undercut under the narrow, rounded corners 19. In other words, the recesses 66 are formed extending under the cantilevered mask formed by the narrow, rounded oxide corners 19 and gate dielectric layer 14 which protects a portion of the substrate 12' which is partially etched on the exposed surfaces of the substrate 12' aside from the gate 16. Note that since the gate electrode 16' is made of silicon, i.e. polysilicon, it will is also be etched forming recesses 67 above the cantilevered mask formed by the narrow, rounded dielectric corners 19.

FIG. 7B shows the device 10 of FIG. 7A after performing an in-situ doped LTE deposition process to deposit silicon as in FIG. 3E to form silicon layer 22G on gate electrode 16' and the epitaxial source/drain regions 22D'/22S' over the remainder of the substrate 12' which fill the recesses 66 including the portions thereof extending beneath the cantilevered mask formed by the narrow, rounded dielectric corners 19. The epitaxial source/drain regions 22D'/22S' include an integral raised doped source region and an integral raised doped drain region, both of which protrude above the top surface of the semiconductor substrate 12' and beyond an exterior surface level of the gate dielectric layer, leaving a gap isolating the gate 16" and the silicon layer 22G from the source/drain regions 22D'/22S'. No drive-in anneal is needed to move the dopant 26 deposited into the source/drain regions 22D'/22S' to a region underlying the surface of the substrate 12' or the gate electrode 16' since the source/drain regions 22D'/22S' fill the space formed by etching down into the substrate 12' in FIG. 7A, and also protrude above the top surface of the semiconductor substrate 12'. In this case, the dopant is deposited directly within the in-situ doped epitaxial silicon regions 22D'/22S'. Much as in FIGS. 1F, 2F, 3F, 4C, 5C and 6I a CH channel region 12C is formed in the substrate 12' between the source/drain regions 22D'/22S', below the gate electrode 16' and the gate dielectric 14.

Figure 8:
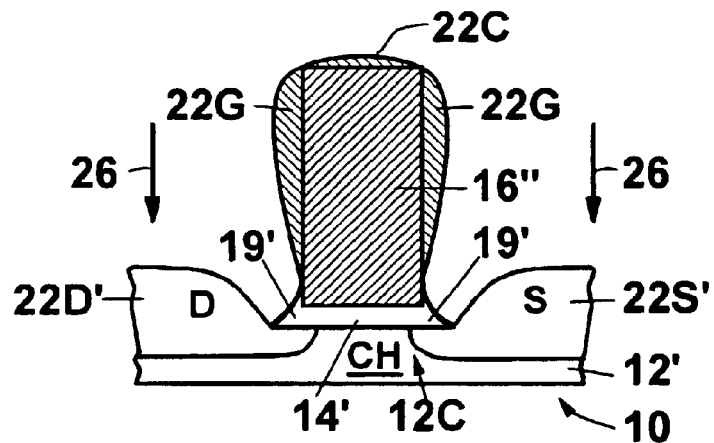
FIG. 8 shows the result of performing the process of FIGS. 7A and 7B where the polysilicon gate electrode is replaced by a metal gate electrode which is not etched by the chosen isotropic etch resulting in the structure shown in FIG. 8 after silicon deposition.

FIG. 8 shows the result of performing the process of FIGS. 7A and 7B where the gate dielectric 14 and the polysilicon gate electrode 16' are replaced by a gate dielectric 14' and a metal gate electrode 16". The metal gate electrode 16" is not etched by the chosen isotropic etch, resulting in the structure shown in FIG. 8 after silicon deposition. As in FIGS. 7A and 7B, silicon layer 22G is formed on the metal gate electrode 16", and the epitaxial source/drain regions 22D'/22S' are formed over the remainder of the substrate 12' filling the recesses shown in FIG. 7A including the spaces extending beneath the cantilevered mask formed by the narrow, rounded dielectric corners 19'; and the dopant is deposited directly within the in-situ doped epitaxial silicon regions 22D'/22S'. As in FIG. 7B, a CH channel region 12C is formed in the substrate 12' between the source/drain regions 22D'/22S', below the gate electrode 16' and the gate dielectric 14'.

Figure 9:
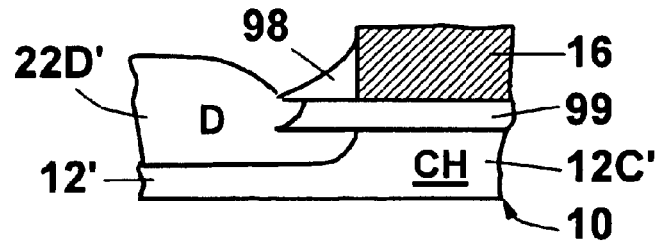
FIG. 9 illustrate a case in which a high K gate dielectric has been used in combination with a deposited silicon oxide sidewall instead of a reoxidized silicon sidewall, resulting in a structure which includes a triangular oxide formed by the COR etch which is comprised of the deposited oxide instead of reoxidized silicon.

Referring to FIG. 9, which shows a case in which a high K gate dielectric 99 with a rounded surface at the base of the gate electrode 16 extending outwardly from the sidewalls thereof which has been used in combination with a deposited silicon oxide sidewall instead of a reoxidized silicon sidewall. The resulting structure includes a triangular deposited silicon oxide structure 98 that is was formed by the COR etch. Thus, in the case of the embodiment shown in FIG. 9, the triangular oxide structure 98 is comprised of the deposited silicon oxide instead of reoxidized silicon. Moreover, the triangular oxide structure 98 overlies the high K dielectric structure 99 and adjoins the bottom of the gate electrode conductor 16. As in FIGS. 7A and 7B, the epitaxial source/drain regions 22D'/22S' are formed over the recesses 66 in the surface of the substrate 12' including filling portions of the recesses 66 extending beneath the cantilevered mask formed by the narrow, rounded dielectric corners 19; and the dopant is deposited directly within the in-situ doped epitaxial silicon regions 22D'/22S'. As in FIG. 7B, CH channel region 12C' is formed in the substrate 12C' adjacent to the drain region 22D' (as well as the source not shown for convenience of illustration) and below the gate electrode 16 and the high K gate dielectric structure 99.

With respect to FIGS. 7, 8 and 9, in situ LTE doping of the source and drain regions can be employed advantageously alone or in combination with small spacers including the shaped oxide spacer produced by the HF and ammonia reaction in accordance with this invention. Selective LTE is also advantageous. Implants can also be useful.

The HF and ammonia COR reaction produces small spacers. The laminated double layer source/drain arrangement described above are valuable because they enable a small spacer shape, while increasing the thickness of the source/drain regions, thereby increasing the conductivity thereof without causing shorts between the gate and the source/drain regions. A conventional source/drain structure would have to be selective.

The double laminated source/drain regions are valuable because with a thin spacer, it increases the thickness and therefore the conductivity of the source/drain regions closer to the gate electrode. The capacitance is reduced between the gate electrode and the source/drain regions relative to a single layer. This is particularly useful with the shapes produced by the HF and ammnonia COR reaction because the small scale shapes and the geometry with the gate are more likely to be subject to shorts. It is more difficult to perform a low resistance deposition without the laminated double layers formed over the source/drain regions formed in the substrate as shown by FIGS. 4C and 5C.

Many other combinations of this embodiment with previously described embodiments will be clear to one skilled in the art. The substrates of the various embodiments described heretofore may be thick layers of silicon or a thin layer of silicon on an insulator, with or without a fully depleted channel. Alternatively, the substrate can be a sliver of silicon possibly oriented perpendicularly with respect to the a wafer surface. Employment of other possible chemistries for with gate oxide layers or other gate dielectric materials will be apparent to those skilled in the art.

The advantages of the present invention may be summarized as follows:

1. Structures made in accordance with this invention can increase the conductivity of the transistors relative to previous designs, especially in the extension regions. The present invention provides two levels of epitaxial silicon source/drain regions raised above the level of the gate dielectric. Related features are as follows:

a. The second, uppermost level is spaced laterally by a dielectric sidewall on the gate electrode.

b. The structures can include a curved spacer at the base of the gate electrode.

c. There is an abrupt lateral dopant concentration change over <20 Å between the source or drain and the channel region.

d. Furthermore, the abrupt lateral dopant concentration change can be over <6 Å between the source or drain and the channel region.

2. The raised source/drain regions are separated from the gate electrode by the curved dielectric spacer at the base of the gate electrode. This design places the source/drain regions closer to the channel region than is otherwise possible. Related features are as follows:

a. Lateral silicon growth on the gate electrode beyond the vertical intersection of the spacer with the underlying horizontal substrate.

b. There is an abrupt lateral dopant concentration change over <20 Å between the source or drain and the channel region.

c. Furthermore, the abrupt lateral dopant concentration change can be over <6 Å between the source or drain and the channel region.

d. In addition, one can employ a metal gate or a metal gate encapsulated with Si, for a high K device.

3. CMOS with an abrupt lateral dopant concentration change over <20 Å between the source or drain and the channel region improves the short channel effect. The device can include epitaxial silicon raised source/drain regions with additional raised source/drain levels.

While this invention has been described in terms of the above specific embodiments, those skilled in the art will recognize that the invention can be practiced with modifications within the spirit and scope of the appended claims, i.e. that changes can be made in form and detail, without departing from the spirit and scope of the invention. Accordingly, all such changes come within the purview of the present invention and the invention encompasses the subject matter of the claims which follow.

We claim:

1. An FET device comprising:
   a semiconductor substrate having a top surface;
   a gate dielectric layer formed on the top surface of the semiconductor substrate, a conductive gate electrode having a top, a base, and sidewalls, with the conductive gate electrode being formed over the gate dielectric layer with an interface therebetween, with the interface extending between the sidewalls and any layers formed thereover at the base of the conductive gate electrode;

the gate dielectric layer having rounded surfaces at the base of the gate electrode extending outwardly from the sidewalls;

a channel region formed in the semiconductor substrate below the gate electrode and the gate dielectric layer; and a silicon layer covering the device forming a raised doped source region and a raised doped drain region protruding above the top surface of the semiconductor substrate and beyond an exterior surface level of the gate dielectric layer.

2. The device of claim 1 wherein a doped source region and a doped drain region are formed in the substrate.

3. The device of claim 1 wherein the silicon layer comprises an epitaxial layer forming the raised doped source region and the raised doped drain region aside from the rounded surfaces of the gate dielectric layer.

4. The device of claim 1 wherein:
the silicon layer comprises an epitaxial layer forming the raised doped source region and the raised doped drain region aside from the rounded surfaces of the gate dielectric layer;
a doped epitaxial silicon cap is formed on the top of the gate electrode; and
a doped epitaxial silicon sidewall layer is formed on the sidewall surfaces of the gate electrode.

5. The device of claim 1 wherein
a doped epitaxial layer is formed as a cap on the top of the gate electrode and as a sidewall layer on the sidewalls of the gate electrode; and
a dielectric coating is formed on the sidewalls of the gate electrode and the rounded surfaces of the gate dielectric layer.

6. The device of claim 1 wherein:
the gate electrode is composed of doped polysilicon;
a doped epitaxial layer is formed as a cap on the top of the gate electrode and as a sidewall layer on the sidewalls of the gate electrode; and
a silicon oxide dielectric coating is formed on the sidewall layer of the gate electrode and the rounded surfaces of the gate dielectric layer.

7. The device of claim 6 wherein:
an insulation coating is formed over the doped epitaxial layer on the sidewalls of the gate electrode and over the rounded surfaces of the gate dielectric layer; and
an additional cap is formed over the cap.

8. The device of claim 7 wherein:
the silicon layer comprises an epitaxial layer forming the raised doped source region and the raised doped drain region aside from the rounded surfaces of the gate dielectric layer;
a doped source region and a doped drain region are formed in the substrate; and
a second silicon layer comprising a doped upper source region covers the raised doped source region device and a doped upper drain region covers the raised doped drain region.

9. The device of claim 7 wherein an additional conductive layer forms the additional cap and covers the raised source region and the raised drain region.

10. The device of claim 9 wherein:
the silicon layer comprises an epitaxial layer forming the raised doped source region and the raised doped drain region aside from the rounded surfaces of the gate dielectric layer;
a doped source region and a doped drain region are formed in the substrate; and
the additional conductive layer comprises a second silicon layer forming a doped upper source region covering the raised doped source region device and forming a doped upper drain region covering the raised doped drain region.

11. The device of claim 1 wherein:
a first dielectric layer is formed on the sidewalls of the gate electrode; and
a barrier layer is formed on the first dielectric layer.

12. The device of claim 11 wherein an additional conductive layer forms a cap over the top of the conductive gate electrode.

13. The device of claim 11 wherein a doped source region and a doped drain region are formed in the substrate.

14. The device of claim 11 wherein the silicon layer comprises an epitaxial layer forming the raised doped source region and the raised doped drain region aside from the rounded surfaces of the gate dielectric layer.

15. The device of claim 11 wherein:
the silicon layer comprises an epitaxial layer forming the raised doped source region and the raised doped drain region aside from the rounded surfaces of the gate dielectric layer; and
a doped source region and a doped drain region are formed in the substrate.

16. The device of claim 15 wherein an additional conductive layer forms a cap over the top of the conductive gate electrode.

17. The device of claim 1 wherein the semiconductor substrate is recessed aside from the channel region and the silicon layer fills the recess forming the raised doped source region and the raised doped drain region.

18. The device of claim 17 wherein an epitaxial layer is form as a cap on the top of the gate electrode and as a sidewall layer on the sidewalls of the gate electrode.

19. The device of claim 1 wherein:
the semiconductor substrate is recessed aside from the channel region with an undercut aside from the channel region beneath the rounded surfaces of the gate dielectric layer, and
the silicon layer fills the recess and the undercut with an integral raised doped source region and an integral raised doped drain region.

20. The device of claim 19 wherein an epitaxial layer is form as a cap on the top of the gate electrode and as a sidewall layer on the sidewalls of the gate electrode.

21. The device of claim 1 wherein:
the semiconductor substrate is recessed aside from the channel region with an undercut aside from the channel region beneath the rounded surfaces of the gate dielectric layer;
the silicon layer fills the recess and the undercut with an integral raised doped source region and an integral raised doped drain region; and
a triangular dielectric layer formed over the rounded surfaces of the gate dielectric layer at the base of the gate electrode.

* * * * *